US006662332B1

(12) United States Patent
Kimmitt

(10) Patent No.: US 6,662,332 B1
(45) Date of Patent: Dec. 9, 2003

(54) INTERLEAVER FOR BURST ERROR CORRECTION

(75) Inventor: Myles Kimmitt, Shrewsbury, MA (US)

(73) Assignee: 3Com Corporation, Santa Clara, CA (US)

(*) Notice: Subject to any disclaimer, the term of this patent is extended or adjusted under 35 U.S.C. 154(b) by 455 days.

(21) Appl. No.: 09/704,076

(22) Filed: Nov. 1, 2000

Related U.S. Application Data

(60) Provisional application No. 60/215,945, filed on Jul. 5, 2000.

(51) Int. Cl.[7] ............................................. H03M 13/00
(52) U.S. Cl. ......................... 714/762; 714/704; 714/701
(58) Field of Search ................................ 714/762, 788, 714/746, 801, 701, 704; 380/28; 341/81

(56) References Cited

U.S. PATENT DOCUMENTS

| 4,486,739 | A |   | 12/1984 | Franaszek et al. ........... 340/347 |
| 4,593,393 | A |   | 6/1986  | Mead et al. .................. 371/37 |
| 4,608,456 | A | * | 8/1986  | Paik et al. ..................... 380/28 |
| 5,056,105 | A |   | 10/1991 | Darmon et al. ................. 375/1 |
| 6,329,935 | B1 | * | 12/2001 | Stephen ......................... 341/81 |

FOREIGN PATENT DOCUMENTS

| EP | 0681373 A2   | 11/1995 |
| EP | 0696108 A1   | 2/1996  |
| GB | 2059723 A    | 4/1981  |
| GB | 2332836 A    | 6/1999  |
| JP | 60-55561 A   | 3/1985  |
| JP | 62-76066 A   | 4/1987  |
| JP | 62-185279 A  | 8/1987  |
| JP | 10-98397 A   | 4/1998  |
| WO | WO 99/54818 A1 | 10/1999 |

OTHER PUBLICATIONS

*IEEE Draft P802.3ab/D6.0; Supplemenl to: Carrier Sense Multiple Access with Collission Detection (CSMA/CD) Access Method and Physical Layer Specification: Physical Layer Parameters and Specifications for 1000 Mb/s Operation over 4 pair of Category 5 Balanced Copper Cabling, Type 1000BASE–T; Mar. 25, 1999.*

* cited by examiner

Primary Examiner—Phung M. Chung
(74) Attorney, Agent, or Firm—Weingarten, Schurgin, Gagnebin & Lebovici LLP

(57) ABSTRACT

A method and apparatus for detecting the location of burst errors in serially transmitted data or reducing the susceptability to burst errors in the serially transmitted data. Successive received data words have bits selectively interleaved over a plurality of interleaved data words via burst interleave logic prior to transmitting the interleaved data words over a serial data channel. The selective bit placement assures that the bits in the original data word are spaced apart by at least a predetermined number of bits when the bits are transmitted over the serial data channel. Word framing is performed on the received serial data stream and the interleaved data words are de-interleaved. In the event of a burst error of m bits or less on the serial data channel, the burst error appears as a single bit error in each recovered data word following transmission over the data channel. An error detection code or error correction code is employed to detect or correct single bit errors in the recovered data words. In one embodiment, the interleave logic is employed in a physical coding layer employing plural serial data channels.

40 Claims, 25 Drawing Sheets

| ↑ | W-3 | W-2 | W-1 | W0 | W1 | W2 | W3 | W4 | W5 | W6 | W7 |
|---|---|---|---|---|---|---|---|---|---|---|---|
| B0 | d-3_0 | d-2_0 | d-1_0 | d0_0 | d1_0 | d2_0 | d3_0 | d4_0 | d5_0 | d6_0 | d7_0 |
| B1 | d-3_1 | d-2_1 | d-1_1 | d0_1 | d1_1 | d2_1 | d3_1 | d4_1 | d5_1 | d6_1 | d7_1 |
| B2 | d-3_2 | d-2_2 | d-1_2 | d0_2 | d1_2 | d2_2 | d3_2 | d4_2 | d5_2 | d6_2 | d7_2 |
| B3 | d-3_3 | d-2_3 | d-1_3 | d0_3 | d1_3 | d2_3 | d3_3 | d4_3 | d5_3 | d6_3 | d7_3 |
| B4 | d-3_4 | d-2_4 | d-1_4 | d0_4 | d1_4 | d2_4 | d3_4 | d4_4 | d5_4 | d6_4 | d7_4 |
| B5 | d-3_5 | d-2_5 | d-1_5 | d0_5 | d1_5 | d2_5 | d3_5 | d4_5 | d5_5 | d6_5 | d7_5 |
| B6 | d-3_6 | d-2_6 | d-1_6 | d0_6 | d1_6 | d2_6 | d3_6 | d4_6 | d5_6 | d6_6 | d7_6 |
| B7 | d-3_7 | d-2_7 | d-1_7 | d0_7 | d1_7 | d2_7 | d3_7 | d4_7 | d5_7 | d6_7 | d7_7 |
| B8 | d-3_8 | d-2_8 | d-1_8 | d0_8 | d1_8 | d2_8 | d3_8 | d4_8 | d5_8 | d6_8 | d7_8 |
| B9 | d-3_9 | d-2_9 | d-1_9 | d0_9 | d1_9 | d2_9 | d3_9 | d4_9 | d5_9 | d6_9 | d7_9 |
| B10 | d-3_10 | d-2_10 | d-1_10 | d0_10 | d1_10 | d2_10 | d3_10 | d4_10 | d5_10 | d6_10 | d7_10 |
| B11 | d-3_11 | d-2_11 | d-1_11 | d0_11 | d1_11 | d2_11 | d3_11 | d4_11 | d5_11 | d6_11 | d7_11 |
| B12 | d-3_12 | d-2_12 | d-1_12 | d0_12 | d1_12 | d2_12 | d3_12 | d4_12 | d5_12 | d6_12 | d7_12 |
| B13 | d-3_13 | d-2_13 | d-1_13 | d0_13 | d1_13 | d2_13 | d3_13 | d4_13 | d5_13 | d6_13 | d7_13 |
| B14 | d-3_14 | d-2_14 | d-1_14 | d0_14 | d1_14 | d2_14 | d3_14 | d4_14 | d5_14 | d6_14 | d7_14 |
| B15 | d-3_15 | d-2_15 | d-1_15 | d0_15 | d1_15 | d2_15 | d3_15 | d4_15 | d5_15 | d6_15 | d7_15 |
| B16 | d-3_16 | d-2_16 | d-1_16 | d0_16 | d1_16 | d2_16 | d3_16 | d4_16 | d5_16 | d6_16 | d7_16 |
| B17 | d-3_17 | d-2_17 | d-1_17 | d0_17 | d1_17 | d2_17 | d3_17 | d4_17 | d5_17 | d6_17 | d7_17 |
| B18 | d-3_18 | d-2_18 | d-1_18 | d0_18 | d1_18 | d2_18 | d3_18 | d4_18 | d5_18 | d6_18 | d7_18 |
| B19 | d-3_19 | d-2_19 | d-1_19 | d0_19 | d1_19 | d2_19 | d3_19 | d4_19 | d5_19 | d6_19 | d7_19 |

| ↑ | W-9 | W-8 | W-7 | W-6 | W-5 | W-4 | W-3 | W-2 | W-1 | W0 | W1 | W2 |
|---|---|---|---|---|---|---|---|---|---|---|---|---|
| B0 | d-9_0 | d-8_0 | d-7_0 | d-6_0 | d-5_0 | d-4_0 | d-3_0 | d-2_0 | d-1_0 | d0_0 | d1_0 | d2_0 |
| B1 | d-9_1 | d-8_1 | d-7_1 | d-6_1 | d-5_1 | d-4_1 | d-3_1 | d-2_1 | d-1_1 | d0_1 | d1_1 | d2_1 |
| B2 | d-9_2 | d-8_2 | d-7_2 | d-6_2 | d-5_2 | d-4_2 | d-3_2 | d-2_2 | d-1_2 | d0_2 | d1_2 | d2_2 |
| B3 | d-9_3 | d-8_3 | d-7_3 | d-6_3 | d-5_3 | d-4_3 | d-3_3 | d-2_3 | d-1_3 | d0_3 | d1_3 | d2_3 |
| B4 | d-9_4 | d-8_4 | d-7_4 | d-6_4 | d-5_4 | d-4_4 | d-3_4 | d-2_4 | d-1_4 | d0_4 | d1_4 | d2_4 |
| B5 | d-9_5 | d-8_5 | d-7_5 | d-6_5 | d-5_5 | d-4_5 | d-3_5 | d-2_5 | d-1_5 | d0_5 | d1_5 | d2_5 |
| B6 | d-9_6 | d-8_6 | d-7_6 | d-6_6 | d-5_6 | d-4_6 | d-3_6 | d-2_6 | d-1_6 | d0_6 | d1_6 | d2_6 |
| B7 | d-9_7 | d-8_7 | d-7_7 | d-6_7 | d-5_7 | d-4_7 | d-3_7 | d-2_7 | d-1_7 | d0_7 | d1_7 | d2_7 |
| B8 | d-9_8 | d-8_8 | d-7_8 | d-6_8 | d-5_8 | d-4_8 | d-3_8 | d-2_8 | d-1_8 | d0_8 | d1_8 | d2_8 |
| B9 | d-9_9 | d-8_9 | d-7_9 | d-6_9 | d-5_9 | d-4_9 | d-3_9 | d-2_9 | d-1_9 | d0_9 | d1_9 | d2_9 |
| B10 | d-9_10 | d-8_10 | d-7_10 | d-6_10 | d-5_10 | d-4_10 | d-3_10 | d-2_10 | d-1_10 | d0_10 | d1_10 | d2_10 |
| B11 | d-9_11 | d-8_11 | d-7_11 | d-6_11 | d-5_11 | d-4_11 | d-3_11 | d-2_11 | d-1_11 | d0_11 | d1_11 | d2_11 |
| B12 | d-9_12 | d3_12 | d-7_12 | d-6_12 | d-5_12 | d-4_12 | d-3_12 | d-2_12 | d-1_12 | d0_12 | d1_12 | d2_12 |
| B13 | d-9_13 | d3_13 | d-7_13 | d-6_13 | d-5_13 | d-4_13 | d-3_13 | d-2_13 | d-1_13 | d0_13 | d1_13 | d2_13 |
| B14 | d-9_14 | d-8_14 | d-7_14 | d-6_14 | d-5_14 | d-4_14 | d-3_14 | d-2_14 | d-1_14 | d0_14 | d1_14 | d2_14 |
| B15 | d-9_15 | d-8_15 | d-7_15 | d-6_15 | d-5_15 | d-4_15 | d-3_15 | d-2_15 | d-1_15 | d0_15 | d1_15 | d2_15 |
| B16 | d-9_16 | d-8_16 | d-7_16 | d-6_16 | d-5_16 | d-4_16 | d-3_16 | d-2_16 | d-1_16 | d0_16 | d1_16 | d2_16 |
| B17 | d-9_17 | d-8_17 | d-7_17 | d-6_17 | d-5_17 | d-4_17 | d-3_17 | d-2_17 | d-1_17 | d0_17 | d1_17 | d2_17 |
| B18 | d-9_18 | d-8_18 | d-7_18 | d-6_18 | d-5_18 | d-4_18 | d-3_18 | d-2_18 | d-1_18 | d0_18 | d1_18 | d2_18 |
| B19 | d-9_19 | d-8_19 | d-7_19 | d-6_19 | d-5_19 | d-4_19 | d-3_19 | d-2_19 | d-1_19 | d0_19 | d1_19 | d2_19 |

*Fig. 10a*

| ↑ | W0 | W1 | W2 | W3 | W4 | W5 | W6 | W7 | W8 | W9 |
|---|---|---|---|---|---|---|---|---|---|---|
| B0 | d0_0 | d1_0 | d2_0 | d3_0 | d4_0 | d5_0 | d6_0 | d7_0 | d8_0 | d9_0 |
| B1 | d-1_2 | d0_2 | d1_2 | d2_2 | d3_2 | d4_2 | d5_2 | d6_2 | d7_2 | d8_2 |
| B2 | d-2_4 | d-1_4 | d0_4 | d1_4 | d2_4 | d3_4 | d4_4 | d5_4 | d6_4 | d7_4 |
| B3 | d-3_6 | d-2_6 | d-1_6 | d0_6 | d1_6 | d2_6 | d3_6 | d4_6 | d5_6 | d6_6 |
| B4 | d-4_8 | d-3_8 | d-2_8 | d-1_8 | d0_8 | d1_8 | d2_8 | d3_8 | d4_8 | d5_8 |
| B5 | d-5_10 | d-4_10 | d-3_10 | d-2_10 | d-1_10 | d0_10 | d1_10 | d2_10 | d3_10 | d4_10 |
| B6 | d-6_12 | d-5_12 | d-4_12 | d-3_12 | d-2_12 | d-1_12 | d0_12 | d1_12 | d2_12 | d3_12 |
| B7 | d-7_14 | d-6_14 | d-5_14 | d-4_14 | d-3_14 | d-2_14 | d-1_14 | d0_14 | d1_14 | d2_14 |
| B8 | d-8_16 | d-7_16 | d-6_16 | d-5_16 | d-4_16 | d-3_16 | d-2_16 | d-1_16 | d0_16 | d1_16 |
| B9 | d-9_18 | d-8_18 | d-7_18 | d-6_18 | d-5_18 | d-4_18 | d-3_18 | d-2_18 | d-1_18 | d0_18 |
| B10 | d0_1 | d1_1 | d2_1 | d3_1 | d4_1 | d5_1 | d6_1 | d7_1 | d8_1 | d9_1 |
| B11 | d-1_3 | d0_3 | d1_3 | d2_3 | d3_3 | d4_3 | d5_3 | d6_3 | d7_3 | d8_3 |
| B12 | d-2_5 | d-1_5 | d0_5 | d1_5 | d2_5 | d3_5 | d4_5 | d5_5 | d6_5 | d7_5 |
| B13 | d-3_7 | d-2_7 | d-1_7 | d0_7 | d1_7 | d2_7 | d3_7 | d4_7 | d5_7 | d6_7 |
| B14 | d-4_9 | d-3_9 | d-2_9 | d-1_9 | d0_9 | d1_9 | d2_9 | d3_9 | d4_9 | d5_9 |
| B15 | d-5_11 | d-4_11 | d-3_11 | d-2_11 | d-1_11 | d0_11 | d1_11 | d2_11 | d3_11 | d4_11 |
| B16 | d-6_13 | d-5_13 | d-4_13 | d-3_13 | d-2_13 | d-1_13 | d0_13 | d1_13 | d2_13 | d3_13 |
| B17 | d-7_15 | d-6_15 | d-5_15 | d-4_15 | d-3_15 | d-2_15 | d-1_15 | d0_15 | d1_15 | d2_15 |
| B18 | d-8_17 | d-7_17 | d-6_17 | d-5_17 | d-4_17 | d-3_17 | d-2_17 | d-1_17 | d0_17 | d1_17 |
| B19 | d-9_19 | d-8_19 | d-7_19 | d-6_19 | d-5_19 | d-4_19 | d-3_19 | d-2_19 | d-1_19 | d0_19 |

Fig. 10b

INTERLEAVER FOR BURST ERROR CORRECTION

CROSS REFERENCE TO RELATED APPLICATIONS

The present application claims priority of U.S. Provisional Application No. 60/215,945 titled Self-Synchronizing Interleaver for Burst Error Correction, filed Jul. 5, 2000.

STATEMENT REGARDING FEDERALLY SPONSORED RESEARCH OR DEVELOPMENT

N/A

BACKGROUND OF THE INVENTION

The present invention relates to high-speed data communications techniques. More particularly, the present invention pertains to a method and apparatus for interleaving and de-correlating data transmitted over a serial data channel so that a burst error within the channel of less than or equal to a specified number of bits can be detected and/or corrected.

High-speed data transmission often occurs on band-limited channels such as multi-mode fiber and backplane links. It is well understood that high-speed transmissions over band-limited links can cause high levels of Inter-Symbol Interference (ISI). In particular, lasers, amplifiers and other components in the data path can limit the analog bandwidth and compound the problems associated with ISI. Band limiting is known to produce a correlation between errors that leads to a localized group of errors that are generally known as burst errors. A burst error is generally defined as two or more bits in error that occur in close proximity to each other. A burst error can contain a run of good bits that are less than, or equal to, the burst window.

High-speed data transmissions are also subject to transmit jitter, near-end crosstalk (NEXT) and far-end crosstalk (FEXT) interference and baseline wander effects that are statistically non-Guassian. These noise and interference sources result in a higher probability of burst errors than in a channel with just white noise.

Coding systems that use error correction can be defeated by the presence of burst errors in a channel. Interleaving is one way of dealing with such errors without the added complexity of multiple-bit error correction codes that are longer than the burst length. Interleaving "whitens" the noise in the channel allowing error correction to achieve coding gain closer to the theoretical limits in white noise. More specifically, interleaving reorders the bits prior to transmission so that a burst error in the channel appears as a series of single bit errors after the receiver applies the reverse interleave function to the incoming data stream.

Interleaving, however, typically requires a new level of synchronization at the receiver to determine the interleave sequence within the received data stream.

It would therefore be desirable to provide an interleave coding and decoding technique that makes burst errors appear as a series of single-bit errors while additionally being self synchronizing when combined with standard frame alignment logic.

BRIEF SUMMARY OF THE INVENTION

A method and apparatus are disclosed for serially transmitting cells over a data link so that any burst error less than a predetermined size within a single channel is detectable and/or correctable. In a preferred embodiment, transmit interleave logic is provided that maps the bits of an input word into predefined bit locations of a plurality of data words to form a plurality of interleaved data words. The interleaved data words are transmitted over a serial data channel. Receive logic is provided that obtains word alignment on the received words and de-interleaves the received words to obtain the original data words input to the transmit logic. By interleaving the bits of a received data word over a plurality of data words prior to transmission over the serial channel, burst errors of n bits or less occurring in a single channel result in n or less single-bit errors in the plurality of data words.

Other features, aspects and advantages of the presently disclosed invention will be apparent from the Detailed Description of the Invention that follows.

BRIEF DESCRIPTION OF THE SEVERAL VIEWS OF THE DRAWING

The invention will be more fully understood by reference to the following detailed description of the invention in conjunction with the drawing of which:

FIG. 5a is a table depicting twenty-bit data words received at the input to the burst interleave logic depicted in FIG. 4;

FIG. 5b is a table depicting interleaving of received data words by the interleave logic of FIG. 4;

FIG. 10a is a table depicting twenty-bit data words received at the input to the burst interleave logic depicted in FIG. 9;

FIG. 10b is a table depicting interleaving of received data words by the interleave logic of FIG. 9;

FIGS. 22a and 2b are a flow diagram depicting an exemplary method of operation of the data ECC decoder within the receive portion of the physical coding sublayer logic.

DETAILED DESCRIPTION OF THE INVENTION

U.S. Provisional Patent Application No. 60/215,945, titled Self-Synchronizing Interleaver for Burst Error Correction and filed Jul. 5, 2000 is hereby incorporated by reference.

System Configuration

Figure 1:
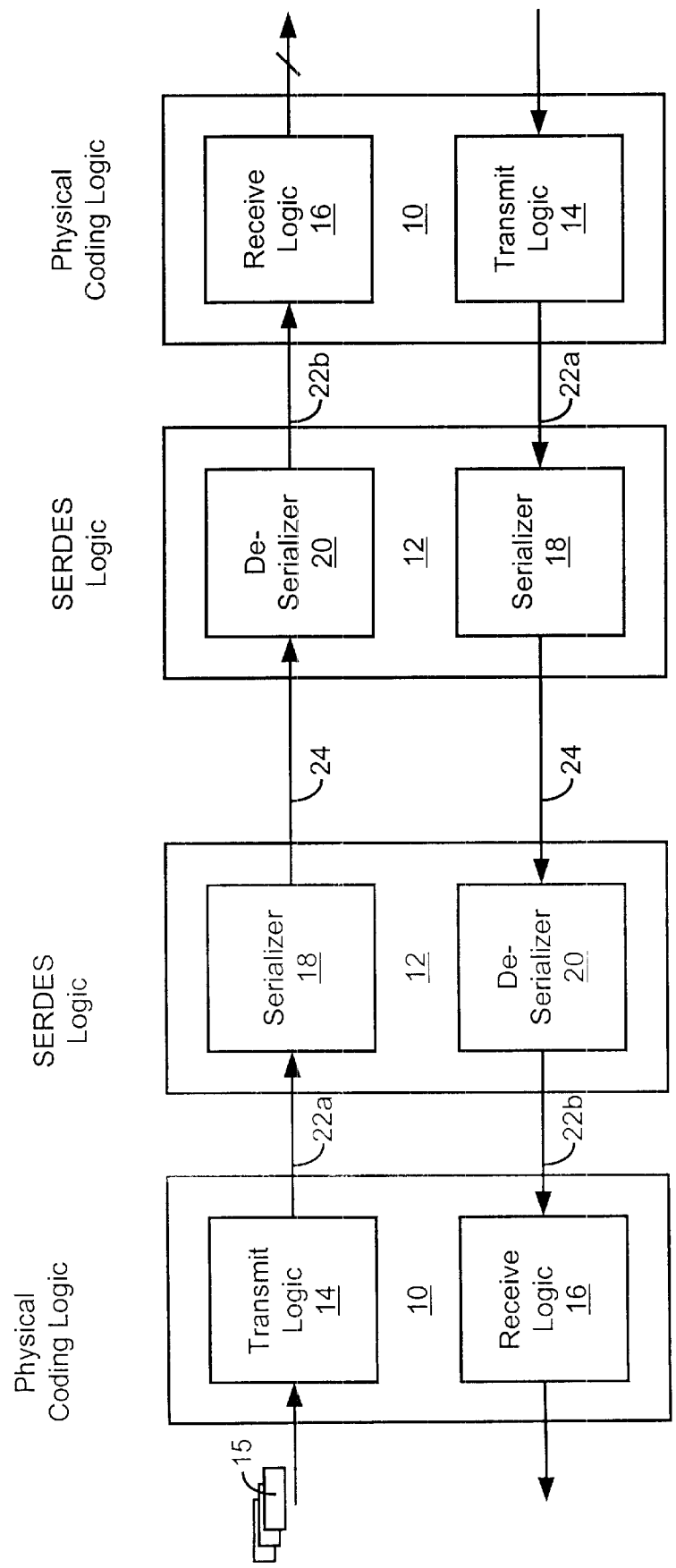
FIG. 1 is a block diagram illustrating a bi-directional system operative to perform burst interleaving in accordance with the present invention.

A system operative in accordance with the present invention and employing the presently disclosed interleaving and de-interleaving logic is depicted in FIG. 1. Referring to FIG. 1, the system includes physical coding logic 10 that is coupled to first serializer/de-serializer (SERDES) logic 12 via parallel buses 22a and 22b as shown. The physical coding logic 10 includes transmit logic 14 and receive logic 16. The SERDES logic 12 includes a serializer 18 that is operative to convert a parallel data word into a serial data stream and a de-serializer 20 that is operative to convert a serial data stream into a parallel data word.

Within a given data channel, transmit logic 14 receives a series of data words 15. In a preferred embodiment, an error correction code (ECC) is generated from one or more received data word(s) and the ECC is concatenated with the data word(s) from which the ECC was generated to form an extended data word. The extended data word is scrambled to de-correlate the data. A framing signal that is employed within receive logic 16 of physical coding logic 10 to achieve word framing following transmission over a serial data channel is generated and appended to the scrambled data to form an extended cipher data word. Transmit logic 14 interleaves the data received in each of the extended cipher data words over a plurality of data words as described in greater detail below to allow detection and/or correction of burst errors up to a predetermined length.

A serial channel may be considered as having a transmit side upstream of the serial data channel 24 and a receive side downstream of the serial data channel 24. On the transmit side of the serial data channel 24, the output from transmit logic 14 is coupled to the input of serializer 18 via the parallel data bus 22a. The output of the serializer 18 is coupled to the serial data channel 24 and the input of a de-serializer 20 of another SERDES logic 12 device receives a serial data stream from the serial data channel 24. The de-serializer 20 converts the received serial data stream into parallel words that are coupled to receive logic 16 via a parallel bus 22b. Receive logic 16 performs word framing on the received data stream. Additionally, receive logic 16 performs de-scrambling of the received cipher data words and de-interleaving of the received extended data words. As a result of the use of the presently described interleaving technique, burst errors of n bits or less in length appear as single bit errors in the original data words recovered following the de-interleaving process. Based upon the error detection and/or correction code employed, single bit errors in the de-interleaved data words can either be detected or corrected. Furthermore, greater levels of error detection and/or correction may be obtained based on the error detection code (EDC) or ECC employed.

Transmit Logic

Figure 2:
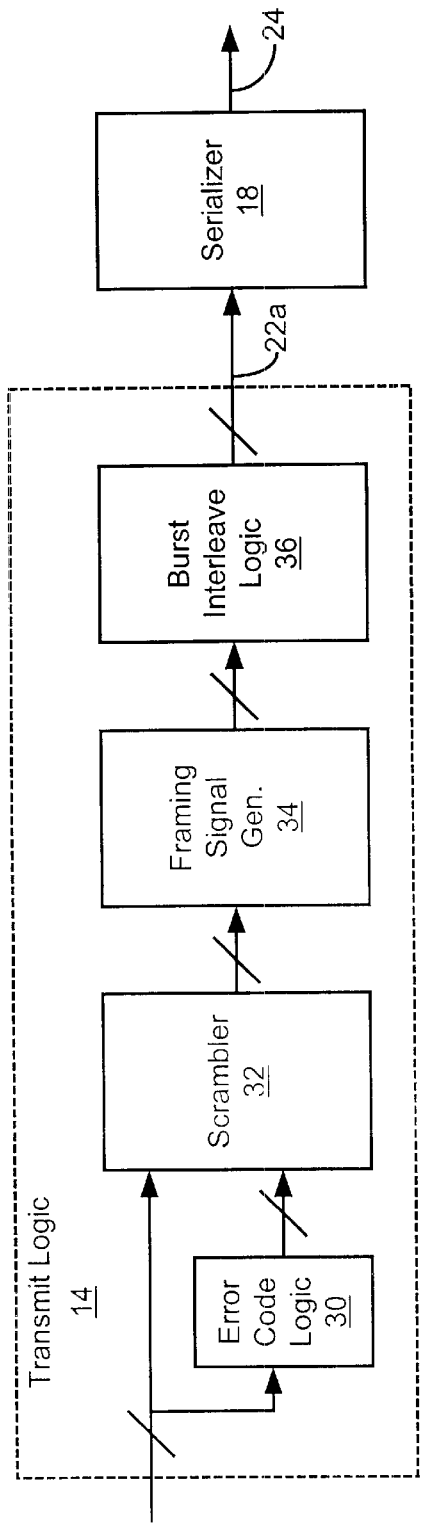
FIG. 2 is a more detailed block diagram of the data path through the transmit logic and serializer depicted in FIG. 1.
Figure 6:
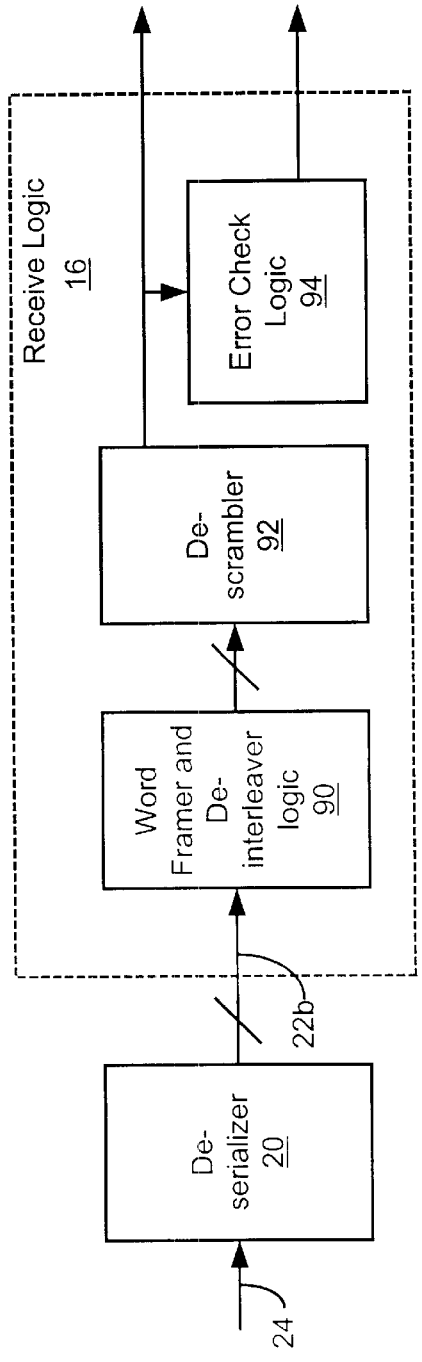
FIG. 6 is a more detailed block diagram illustrating the de-serializer and receive logic depicted in FIG. 1.

Exemplary transmit logic 14 is illustrated in greater detail in FIG. 2. In the exemplary transmit logic 14 13 bit parallel data words are received at the input of transmit logic 14. A 5 bit ECC is generated in error code generating logic 30. In a preferred embodiment, the 5 bit ECC selected may be employed to correct single bit errors in the corresponding data word. The received data word and the ECC are combined to form an 18 bit extended data word and the extended data word is applied to a scrambler 32 that scrambles the input data by exclusive ORing the input data with a pseudo random binary sequence (PRBS). The scrambler 32 provides DC balance, inserts transitions and spreads the signal spectrum across available bandwidth to reduce EMI. In a preferred embodiment, the scrambler 32 comprises a sidestream scrambler. The output from the scrambler 32 is coupled to the input of a framing signal generator 34. The framing signal generator generates a framing signal that is used by receive logic 16 (FIG. 1) to achieve word alignment following receipt of the serially transmitted data stream over the serial channel 24 (FIG. 1). The framing signal may comprise a parity bit, a predetermined number of bits having a specified known value or any other suitable signal that may be used by receive logic 16 to achieve word framing following transmission of the serial data stream over the serial data channel 24. In the present example, it is assumed that the framing signal comprises a single parity bit. An idle bit is generated to indicate when the transmitted character comprises an idle character. The idle bit is used to reacquire the seed for use by the descrambler 92 (FIG. 6). The framing signal and the idle bit are appended to the cipher data word to form an extended cipher data word, which in the illustrated embodiment comprises a twenty-bit wide extended cipher data word.

The extended cipher data word is coupled to the input of burst interleave logic 36. The burst interleave logic 36 interleaves the data contained within the extended cipher data word over a plurality of data words to form a plurality of interleaved data words of width equal to the extended cipher data word. The interleaved data words are serialized by the serializer 18 and transmitted over the serial data channel 24.

Side Stream Scrambler

Figure 3:
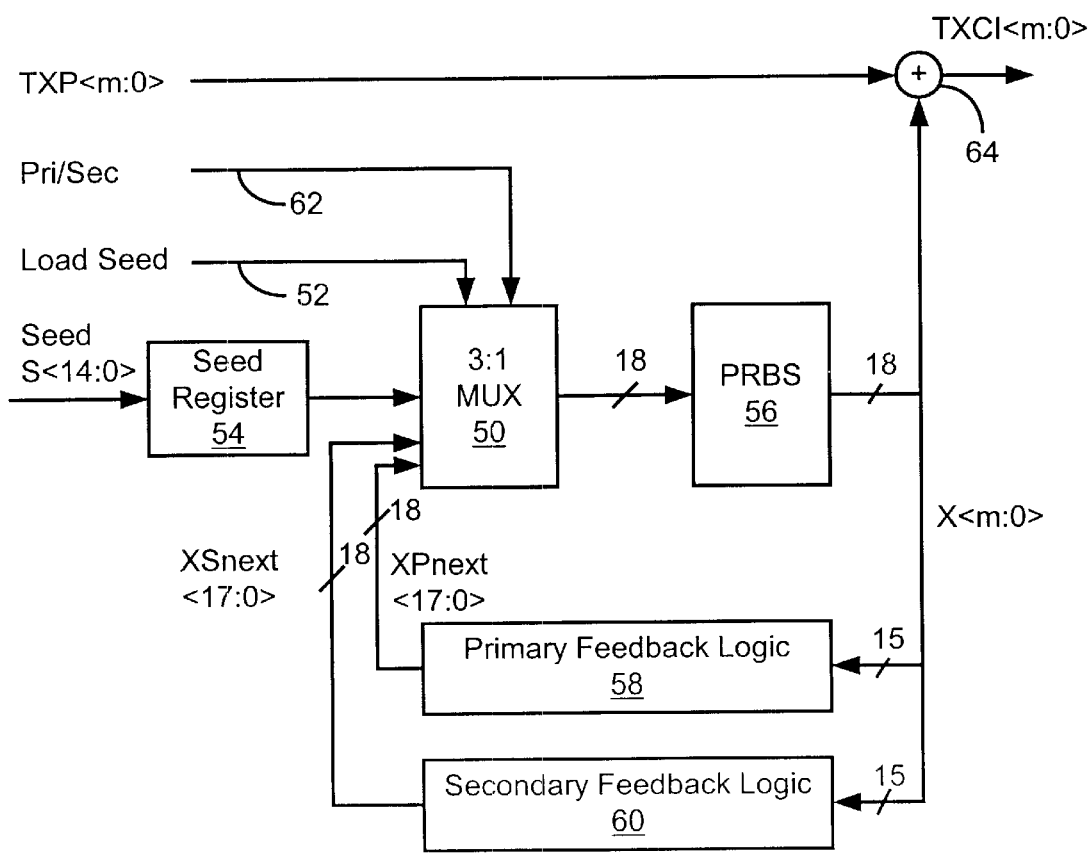
FIG. 3 is a block diagram illustrating exemplary logic for the scrambler depicted in FIG. 2.

An exemplary side-stream scambler implementation is depicted in FIG. 3. The side stream scambler includes a three to one MUX 50 that receives a Load Seed signal 52. The Load Seed signal 52 enables the loading of 15 bits of seed data from a seed register 54. Additionally, the three to one MUX 50 is coupled to a PRBS register 56 via a MUX output bus. The outputs of the PRBS register 56 are coupled to the inputs of primary feedback logic 58 and secondary feedback logic 60 and the outputs of the primary and secondary feedback logic 58 and 60 are fed back to the inputs of the three to one MUX 50. The primary or secondary feedback logic outputs are selected as the operative inputs to the three to one MUX 50 in response to a primary/secondary selection control signal 62. Exclusive OR (XOR) logic 64 receives as inputs, over the TXP bus, the extended data word comprising the received data word(s) and the ECC generated by the Error Code Logic 30 (FIG. 2). Additionally, XOR logic 64 receives as inputs the PRBS register 56 outputs denoted as X<m:0>. The signals on TXP<m:0> and X<m:0> are exclusive ORed by XOR logic 64 to produce cipher data TXCI<m:0> at the scrambler outputs TXCI<m:0>.

The two generator polynomials used for the primary and secondary PRBS15 sequences are:

$G_P(x)=1+x^{14}+x^{15}$  (Primary generator)

$G_S(x)=1+x^{11}+x^{15}$  (Secondary generator)

These sequences have known linear feedback shift register (LFSR) implementations. To achieve high speed, the physical coding logic 10 employs an 18 bit parallel implementation for the side scramblers 32. The 18 bit parallelism is obtained by applying 18 levels of recursion to the LFSR equations to produce the bus wide pseudo random binary sequence generator structure illustrated in FIG. 3.

The feedback equations for the primary sequence are shown below. The bit ordering is such that the pseudo random binary sequence will appear on the serial lines in the same order as would be generated by the LFSR approach.

XPnext0=X3+X4;
XPnext1=X4+X5;
XPnext2=X5+X6;
XPnext3=X6+X7;
XPnext4=X7+X8;
XPnext5=X8+X9;
XPnext6=X9+X10;
XPnext7=X10+X11;
XPnext8=X11+X12;
XPnext9=X12+X13;
XPnext10=X13+X14;
XPnext11=X0+X1+X14;
XPnext12=X0+X2;
XPnext13=X1+X3;
XPnext14=X2+X4;
XPnext15=X3+X5;
XPnext16=X4+X6;
XPnext17=X5+X7;

While a single channel is illustrated in FIG. 1 for transmitting data in respective opposing directions, as discussed below, data may be transmitted in a particular direction over plural serial channels in which case plural transmitters and plural side scramblers 32 may be employed. In such event, it may be desirable to offset the seeds for the respective side scramblers in time to de-correlate the data forwarded over the respective channels. The primary seeds to start up a four-channel transmitter are:

$S_A$=0x7FFF (M(0))
$S_B$=0x7F00 (M(½))
$S_C$=0x70FF (M(¼))
$S_D$=0x780F (M(¾))

where M(x) denotes the relative starting position in the maximum length sequence. If a single channel is employed, the value $S_A$ may be used for the initial primary seed value.

Similarly, the feedback equations for the secondary sequence are shown below.

XSnext0=X3+X7;
XSnext1=X4+X8;
XSnext2=X5+X9;
XSnext3=X6+X10;
XSnext4=X7+X11;
XSnext5=X8+X12;
XSnext6=X9+X13;
XSnext7=X10+X14;
XSnext8=X0+X4+X11;
XSnext9=X1+X5+X12;
XSnext10=X2+X6+X13;
XSnext11=X3+X7+X14;
XSnext12=X0+X8;
XSnext13=X1+X9;
XSnext14=X2+X10;
XSnext15=X3+X11;
XSnext16=X4+X12;
XSnext17=X5+X13;

The secondary seeds to start a four-channel transmitter up are:

$S_A$=0x7FFF (M(0))
$S_B$=0x00CC (M(½))
$S_C$=0x0AAA (M(¼))
$S_D$=0x0008 (M(¾))

where M(x) denotes the relative starting position in the maximum length sequence. If a single channel transmitter is employed, the value $S_A$ may be used for the initial secondary seed value.

The outputs of the side scrambler provides scrambled or cipher data that is identified as TXCIa<m:0>. In the illustrated embodiment, the cipher data word comprises an 18 bit word and m=18. The side scrambler output bus is coupled to the inputs of the Framing Signal Generator 34 (FIG. 2).

Framing Signal Generator

A indicated above, the Framing Signal Generator 34 appends the framing signal to the cipher data word TXCI<m:0> to form the extended cipher data word. Although the framing signal may comprise a parity signal, a fixed bit, a series of known bits, or any other suitable signal that may be employed for detecting proper word framing, for purposes of the present discussion, it is assumed that the framing signal comprises a single parity bit. The extended cipher data word is coupled from the output of the framing signal generator 34 to the input of the burst interleave logic 36.

Burst 4 Interleave Logic

Figure 4:
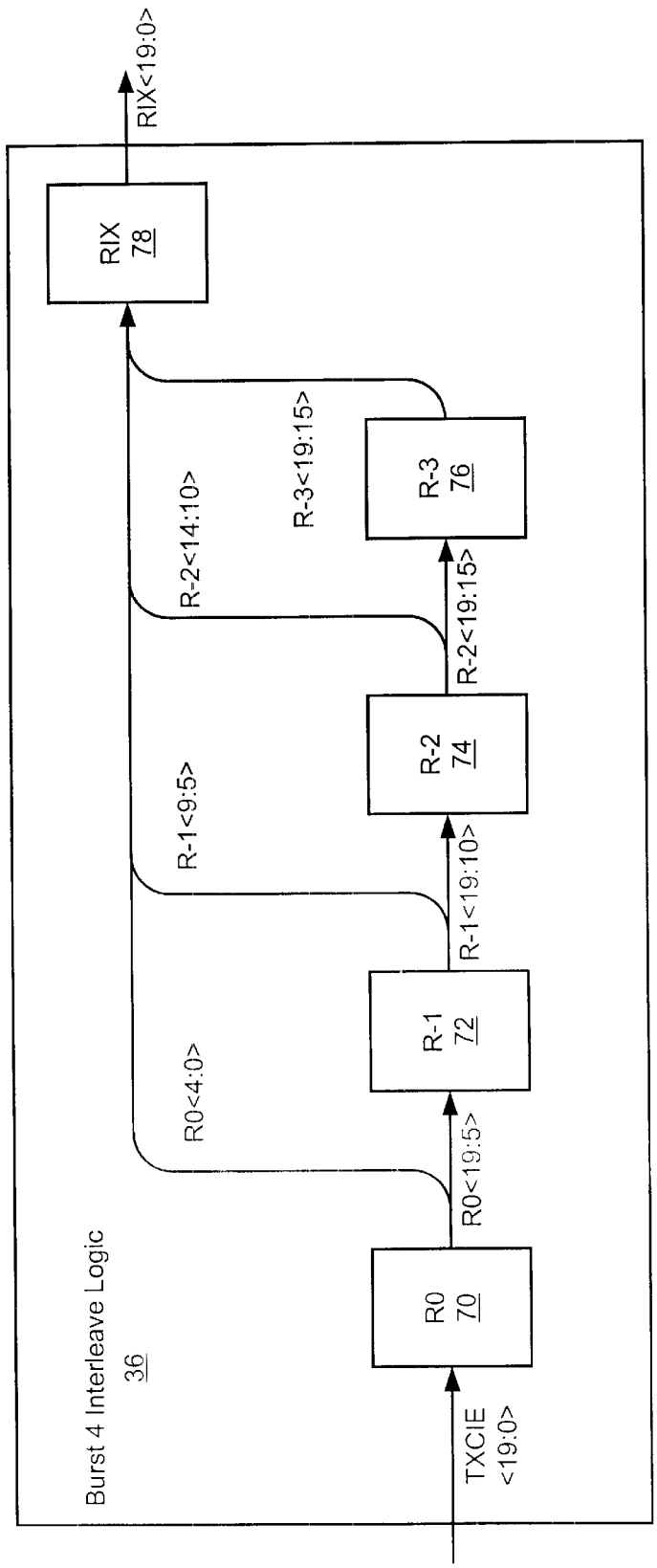
FIG. 4 is a block diagram illustrating burst interleave logic for performing interleaving of a twenty bit word over four interleaved words for transmission over the serial data channel depicted in FIGS. 1 and 2.

Exemplary burst interleave logic 36 is depicted in greater detail in FIG. 4. As will be apparent, the burst interleave logic 36 may interleave the extended cipher data words over a desired number of data words to accommodate burst errors of a predetermined length. Interleaving the extended cipher data over a greater number of data words permits burst errors of a greater length to be detected and/or corrected. The burst interleave logic 36 depicted in FIG. 4 is referred to herein as burst 4 interleave logic to denote that the bits of the extended cipher data word are interleaved over four data words so as to permit detection and/or correction of up to a four bit burst error in a channel. More specifically, the bits of the extended cipher data word are scattered across four interleaved data words in a predetermined manner. As a result of this interleaving, each bit of the original extended cipher data word is separated by a minimum distance of four from any other bit in the same word on the serial data channel 24. A 4-bit burst error in the serial data channel will appear as four single bit errors in four data words following de-interleaving of the received data. Accordingly, based upon the error detection or correction code employed, the single bit errors in the respective data words may be detected or corrected, as applicable.

Referring to FIG. 4, the exemplary burst 4 interleave logic 36 includes registers R0 70, R-1 72, R-2 74, R-3 76 and RIX 78. Each extended cipher data word (TXCIE<19:0>) received at the burst interleave logic 36 is stored in the register R0 70. The registers R0 70, R-1 72, R-2 74, R-3 76 and RIX 78 are commonly clocked. Each word appearing at the output of the register RIX 78 thus includes bits from the data word last received at register R0 70 and the three previously received data words.

More specifically, the output bits from the register R0 70 are divided such that bits R0<4:0> are coupled to selected inputs of register RIX 78 and bits R0<19:5> are coupled to register R-1 72. Additionally, the output bits from the register R-1 72 are coupled to register R-2 74 and selected input bits of register RIX 78. More specifically, in the burst 4 interleave logic, bits R-1<9:5> are coupled to selected bits of the input of register RIX 78 and bits of R-1 72 designated as R-1<19:10> are coupled to the inputs of register R-2 74. Furthermore, output bits of register R-2 74 designated R-2<14:10> are coupled to selected inputs of the register RIX 78 and output bits of R-2 74 designated R-2<19:15> are coupled to the inputs of register R-3 56. Finally, the output bits of register R-3 76 designated R-3<19:15> are coupled to selected inputs of register RIX 78.

The interleave equation for the burst 4 interleave logic is set forth below:
RIX<19:0>=R-3<19>, R-2<14>, R-1<9>, R<4>, R-3<18>, R-2<13>, R-1<8>, R<3>, R-3<17>, R-2<12>, R-1<7>, R<2>, R-3<16>, R-2<11>, R-1<6>, R<1>, R-3<15>, R-2<10>, R-1<5>, R<0>

The register designated R0 70 contains the bits in the last received word. Bits designated R-1<x:y> are bits received in the word received just prior to the word currently in register R0 70. Bits designated R-2<x:y> are bits received in the word received two words before the word currently in the register R0 70. Finally, bits designated R-3<x:y> are bits received in the word received three words before the word currently in the register R0 70.

Figure 5B:
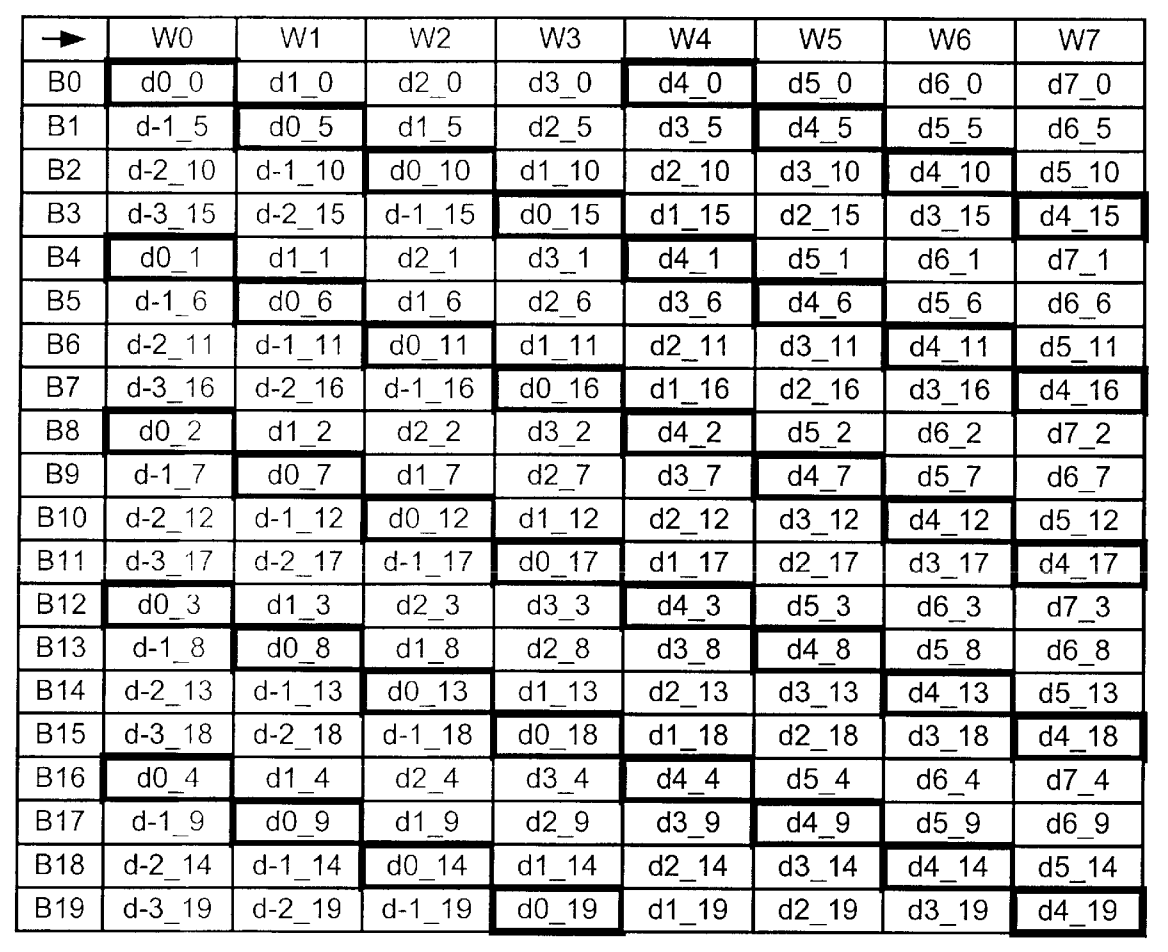

The effect of the burst 4 interleave logic 36 is apparent from the interleave functions depicted in FIGS. 5a and 5b. FIG. 5a depicts 20-bit input words in columns W-3 through W7. W7 corresponds to the most recently received word. FIG. 5a shows the resulting output words appearing at the output of the RIX register 78 (FIG. 4) following application of the burst 4 interleave function. The contents of the rows designated B0 through B19 in FIGS. 5a and 5b correspond to the data-bits within the input and output words, respectively.

In FIG. 5b, the column designated W0 represents the first of the illustrated interleaved data words transmitted over the serial data channel 24 (FIGS. 1, 2) and the column designated W7 represents the last of the illustrated data words transmitted over the serial data channel 24 (FIGS. 1, 2). The input data word W0 contains data bits d0_0 through d0_19 within bit locations B0–B19 (FIG. 5a). As seen in FIG. 5b, the bits of the received input data word are interleaved among a plurality of data words that are output from the burst 4 interleave logic 36. More specifically, bits d0_0, d0_1, d0_2, d0_3 and d0_4 contained in the received data word W0 (FIG. 5a) are transmitted across the serial data channel 24 within bit locations B0, B4, B8, B12 and B16 of the output data word W0 respectively (FIG. 5b). Additionally, bits d0_5, d0_6, d0_7, d0_8 and d0_9 contained in the received data word W0 (FIG. 5a) are transmitted across the serial data channel 24 within bit locations B1, B5, B9, B13 and B17 of the output data word W1 respectively (FIG. 5b). Furthermore, bits d0_10, d0_11, d0_12, d0_13 and d0_14 contained in the received data word W0 (FIG. 5a) are transmitted across the serial data channel 24 within bit locations B2, B6, B10, B14 and B18 of the output data word W2 respectively (FIG. 5b). Finally, bits d0_15 d0_16, d0_17, d0_18 and d0_19 contained in the received data word W0 (FIG. 5a) are transmitted across the serial data channel 24 within bit locations B3, B7, B11, B15 and B19 of the output data word W3 respectively (FIG. 5b). As apparent from FIGS. 5a and 5b, the bits of the input data words are scattered across four successive output data words. More specifically, the bits of each input data word are separated by a minimum distance of four from any other bits within the same data word within the serial data channel 24 (FIGS. 1, 2). Consequently, a burst error of four bits or less on the serial data channel 24 can produce only a single bit error in any given input data word following de-interleaving of the serialized data when utilizing the burst 4 interleaving technique herein described.

Serializer

Each interleaved data word appearing at the output of the burst 4 interleave logic 36 is coupled to the input of the corresponding serializer 18 (FIG. 2). The serializer 18 converts the parallel interleaved data words into a serialized data stream. The serialized data stream is passed from the serializer 18 to a transmit side physical medium dependent interface as known in the art (not shown) to generate the appropriate voltage and drive characteristics for transmission of the serialized data stream over the serial data channel 24 (FIG. 2).

De-Serializer

At the receive end of the link, the serial data channel 24 terminates at a receive side physical medium dependent interface as known in the art (not shown) that converts the received serial data stream into appropriate logic levels for use by the de-serializer 20. The de-serializer 20 converts the received serial data stream into a series of parallel data words. In the present illustrative example, the de-serializer converts the serialized data stream into a series of 20-bit wide parallel data words. The output of the de-serializer 20 is coupled to receive logic 16 over a parallel data bus 22b (FIG. 1).

Receive Logic

Receive logic 16 is depicted with greater particularity in FIG. 6. Receive logic 16 includes word framer and de-interleaver logic 90, de-scrambler 92 and error check logic 94. The output of the de-serializer 20 is coupled to the word framer and de-interleaver logic 90 via parallel data bus 22b. The output of the word framer and de-interleaver logic 90 is coupled to the de-scrambler 92. Error check logic 94 is coupled to the output of the de-scrambler 92. Error check logic 94 provides an indication of an error in a data word or alternatively, generates a syndrome based upon the received data word that may be employed to correct an error in a recovered data word if an error correction code is used. A more detailed block diagram of the word framer and de-interleaver logic 90 is shown in FIG. 7.

Word Framer and De-interleaver Logic

Figure 7:
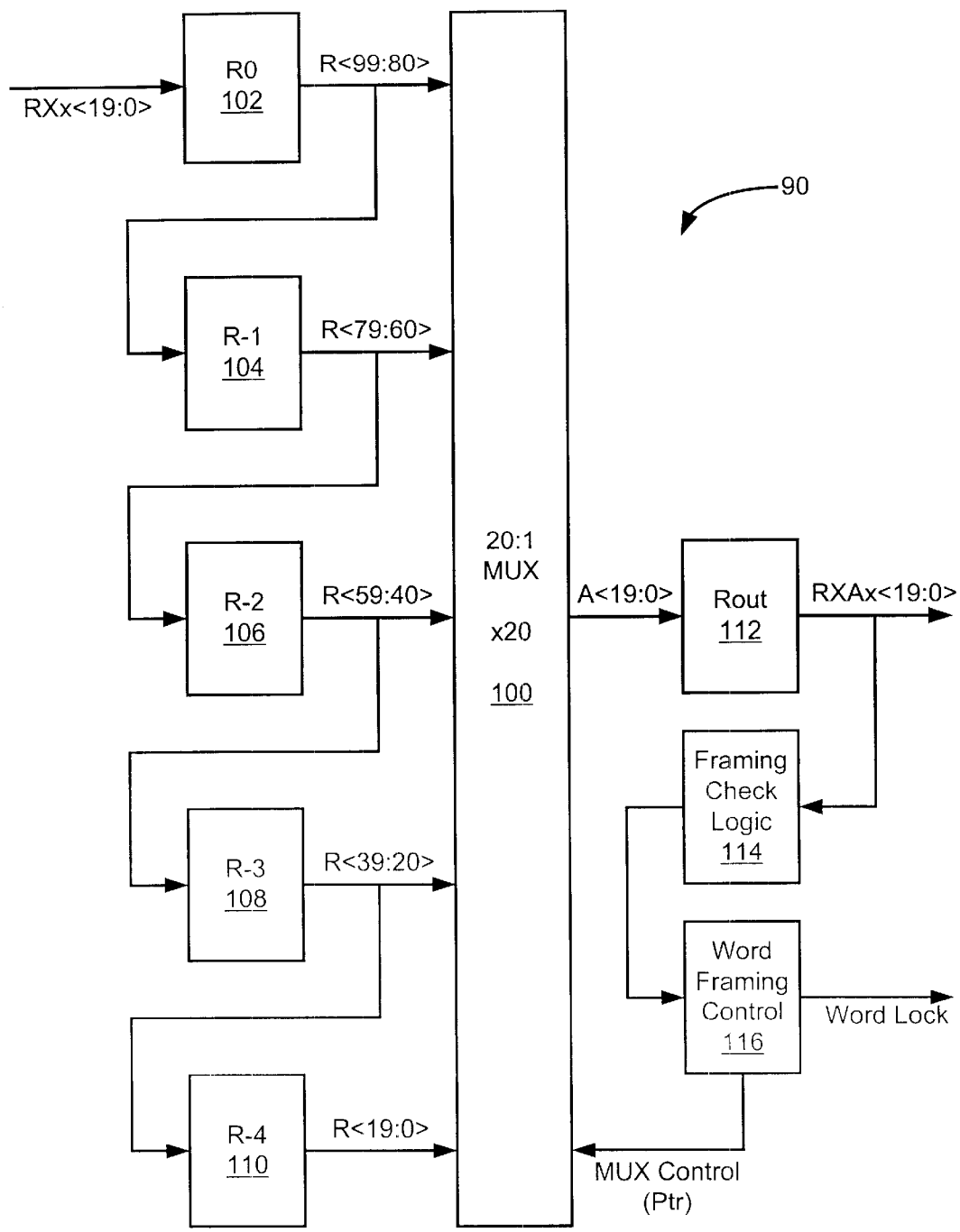
FIG. 7 is a more detailed block diagram illustrating the word framer and de-interleaver logic depicted in FIG. 6 for de-interleaving words interleaved using the logic depicted in FIG. 4.

Referring to FIG. 7, the word framer and de-interleaver logic 90 includes multiplexer logic 100 that includes twenty 20:1 multiplexers 100. The multiplexer logic 100 provides at its output, twenty bits selected from 100 bits comprising five consecutive twenty-bit data words received over the serial data channel 24. More specifically, each two-bit word received from the de-serializer 20 is stored in register R0 102. When the next word is loaded from the de-serializer into register R0 102, the content of register 102 is loaded into register R-1 104, the content of register R-1 104 is loaded into register R-2 106, the content of register R-2 106 is loaded into register R-3 108 and the content of register R-3 108 is loaded into register R-4 110. Thus, multiplexer 100 has access to 100 successively received bits at its inputs. The twenty multiplexers are coupled to the outputs of the respective registers R0 102, R-1 104, R-2 106, R-3 108 and R-4 110 such that when proper framing is obtained, the bits forming a single data word will appear at the output A<17:0> with the two framing bits appearing at A<19:18>.

Proper framing is obtained in the following manner. The MUX Control pointer is initialized by the word framing control logic 116 to an initial pointer value and a series of words are sequentially stored in the output register Rout 112. The last two bits of the twenty-bit word in the illustrative embodiment are assumed to be the framing bits. The value of the framing bits are checked in the framing check logic 114 over a large number of words by comparing the received framing bits to the expected value for those bits to determine if proper word framing exists. Since bits 0:17 of the extended cipher data words are scrambled it is highly improbable that proper framing will be found coincidentally. For example, the test may be performed over 128, 256 or any other suitable number of word samples. If word framing is proper, the correct framing bits will be found in each of the word samples. In this event, the word framing control logic 116 asserts a word lock signal to indicate that proper framing has been achieved. If word framing is improper, the specified framing bits will not be detected in each of the word samples. In the event it is determined that word framing is improper, the MUX Control Pointer is adjusted to select another possible one of the 20 possible positions for proper framing and the above-described test is repeated.

While the above-described framing signal comprises a single parity bit, it should be appreciated that a single bit of known value may be employed to achieve word framing in the above-described manner. Additionally, as described above, the framing signal may comprise a parity bit having a predetermined parity value and the framing check logic may verify that the received bit corresponding to the assumed parity has the proper parity for each of the predetermined number of word samples. Any other signal that can be used to verify proper word framing may also be employed noting that if multiple bit framing signals are employed, the interleave equations will need to accommodate a greater number of bits for a given width data word.

Figure 8:
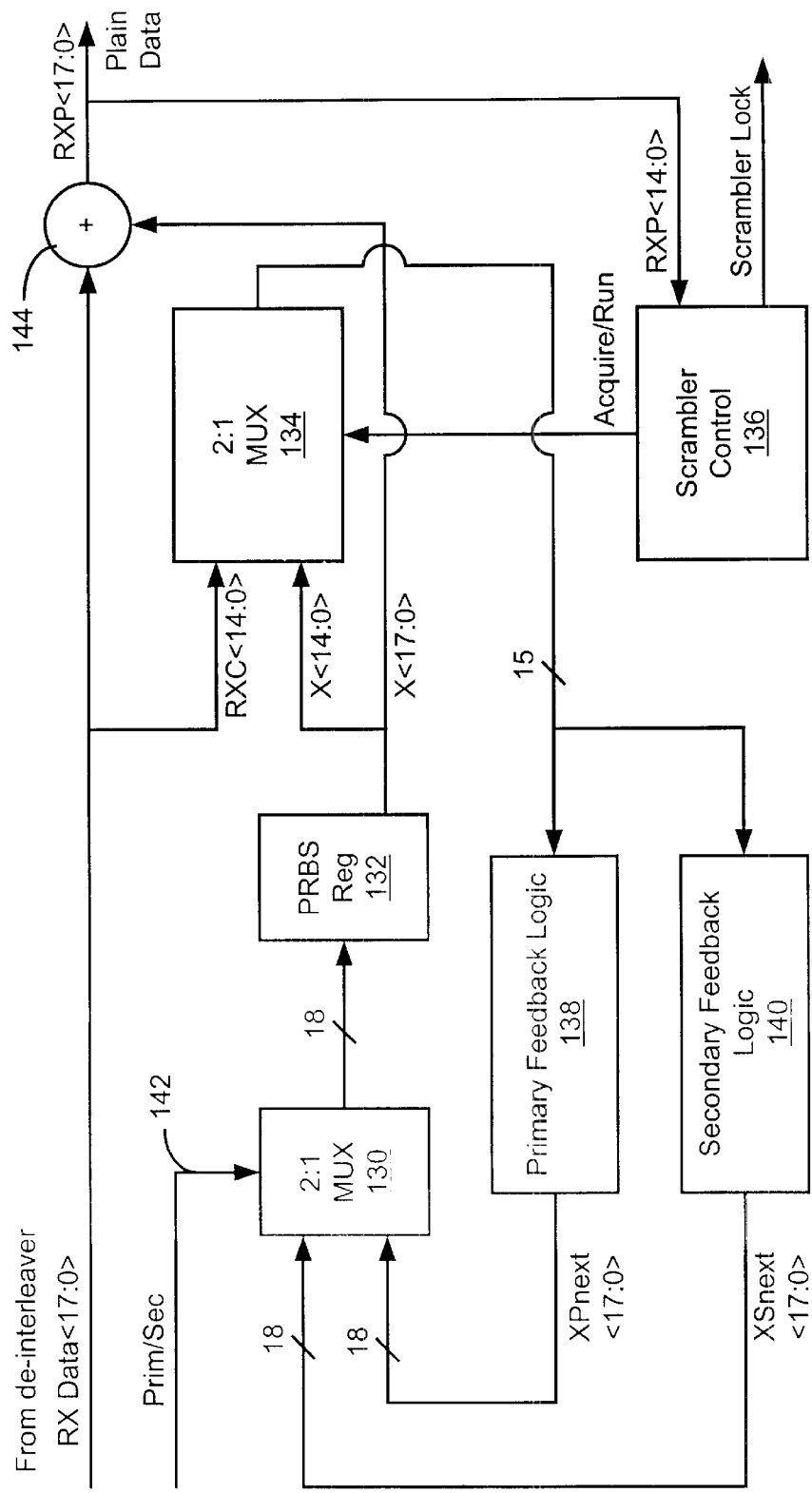
FIG. 8 is a more detailed block diagram of the de-scrambler logic depicted in FIG. 6.

The multiplexer (MUX) 100 serves to de-interleave one data word upon receipt of each new word at register R0 102 from the serializer. More particularly, the multiplexer 100 selects the relevant output bits from the registers R0 102, R-1 104, R-2 106, R-3 108 and R-4 110 and reassembles the original data words in register Rout 112 once proper word framing has been obtained. Thus, register Rout 112 provides, at its output, the cipher data words generated by the scrambler 32 (FIG. 2). The output of the register Rout 112 is coupled to the input of de-scrambler 92 (FIG. 6). A logic block diagram depicting the de-scrambler 92 is shown in FIG. 8.

De-Scrambler

The de-scrambler 92 uses the same side scrambler structure as the transmit logic 14 with the added complexity of having to acquire the current scrambler state. The receive logic 16 can detect when an Idle cell is being transmitted via control state information conveyed over the serial data channel 24. Idle cells are transmitted frequently during the Inter Packet Gap (IPG) of a normal Ethernet transmission. Presence of Idle cells can be guaranteed by use of the well known Far End Fault protocol given in the Ethernet standard. The Idle state is defined to have 0x0000 in the 16 least significant bits of the data payload in each channel. The idle cells are scrambled in each channel however, if the data field contains zeros then the lower fifteen bits of the data word constitutes the scrambler state (seed). The scrambler seed may thus recovered and loaded into the receiver de-scramblers during idle cell transmission. The sequence can be completely recovered in one idle period because the sequence length is 15 and the complete state is defined in the data payload.

A state machine controls the de-scrambler state acquisition and verifies that the scrambler remains in lock during Idle cells.

Referring to FIG. 8, scrambler control logic 136 identifies when an idle character is being transmitted. In the illustrated embodiment, the idle bit is employed to indicate that an idle character is being transmitted and such bit is provided as an input to the scrambler control logic 136. In response to detection of an idle character, an acquire/run signal is conveyed to the 2:1 MUX 134 to acquire the seed for the respective channel.

An exemplary side-stream de-scrambler implementation is depicted in FIG. 8. 2:1 MUX 130 has an output bus that is coupled to PRBS register 132. The output of PRBS register 132 is coupled to one input of 2:1 MUX 134. Received cipher data from the de-interleaver logic is coupled to the second input of 2:1 MUX 134. The MUX 134 is controlled by Scrambler Control 136. The MUX 134 is set to accept cipher data from the de-interleaver during acquisition or set to accept the output of PRBS register 132 during normal receive operation. The output of the MUX 134 is coupled to the inputs of primary feedback logic 138 and secondary feedback logic 140. The outputs of the primary and secondary feedback logic 138 and 140 are fed back to the inputs of the 2:1 MUX 130. Either the primary or secondary feedback logic outputs are selected as the operative input to the 2:1 MUX 130 in response to a primary/secondary selection control signal 142. Exclusive OR logic 144 receives as inputs cipher data from the word framer and de-interleaver logic 90 (FIG. 6) and the PRBS register 132 outputs. The data from the de-interleave logic 90 and the PRBS Register 132 are exclusive ORed by exclusive OR logic 144 to produce plain data RXP<17:0> at the de-scrambler output; e.g. RXP<17:0>.

The feedback equations for the primary sequence are the same as for the scrambler 32 (FIGS. 2, 3) and are shown below.

XPnext0=X3+X4;
XPnext1=X4+X5;
XPnext2=X5+X6;
XPnext3=X6+X7;
XPnext4=X7+X8;
XPnext5=X8+X9;
XPnext6=X9+X10;
XPnext7=X10+X11;
XPnext8=X11+X12;
XPnext9=X12+X13;
XPnext10=X13+X14;
XPnext11=X0+X1+X14;
XPnext12=X0+X2;
XPnext13=X1+X3;
XPnext14=X2+X4;
XPnext15=X3+X5;
XPnext16=X4+X6;
XPnext17=X5+X7;

Similarly, the feedback equations for the secondary sequence are the same as for the scrambler 32 (FIGS. 2, 3) and are shown below.

XSnext0=X3+X7;
XSnext1=X4+X8;
XSnext2=X5+X9;
XSnext3=X6+X10;
XSnext4=X7+X11;
XSnext5=X8+X12;
XSnext6=X9+X13;
XSnext7=X10+X14;
XSnext8=X0+X4+X11;
XSnext9=X1+X5+X12;
XSnext10=X2+X6+X13;
XSnext11=X3+X7+X14;
XSnext12=X0+X8;
XSnext13=X1+X9;
XSnext14=X2+X10;
XSnext15 X3+X11;
XSnext16=X4+X12;
XSnext17=X5+X13;

The output of the de-scrambler appears at the output of the exclusive OR logic 144 and produces plain data that corresponds to the original data words received at the input to the transmit logic 14 (FIGS. 1, 2).

Error Check Logic

The output of de-scrambler 92 includes the payload plus the ECC as plain unscrambled data. Accordingly, the error check logic 94 (FIG. 6) may be employed to generate an ECC syndrome and to determine whether the received ECC matches the generated ECC. If the two codes do not match, the ECC may be employed to correct a single bit error in the received data word. Alternatively, if the Error Check Logic 94 comprises EDC only, in the event a single bit error is identified, an indication of the single bit error can be provided.

Thus, utilizing the burst 4 interleave logic 36 and the burst 4 de-interleave logic 90, burst errors of 4 bits or less in the serial data channel 24 appear as a single bit error in the recovered data words output from the de-scrambler 92. The single bit errors are detectable or correctable depending upon the error code employed.

While a four bit burst error is detectable or correctable using the burst 4 logic described above, in may be desirable to be able to detect or correct burst errors of lengths greater than four bits. Using the techniques hereinabove described, it should be apparent that burst errors or greater length may be detected or corrected by utilizing variations on the above-described burst interleave logic. Exemplary interleave logic and de-interleave logic are illustrated that serve to scatter bits of a received data word over ten (10) interleaved data words. By scattering the bits of a single received word over the ten interleaved data words a burst error up to ten bits in length on the serial data channel appears as a single bit error in the recovered original data words at the output of the de-scrambler 92.

Burst 10 Interleave Logic

Figure 9:
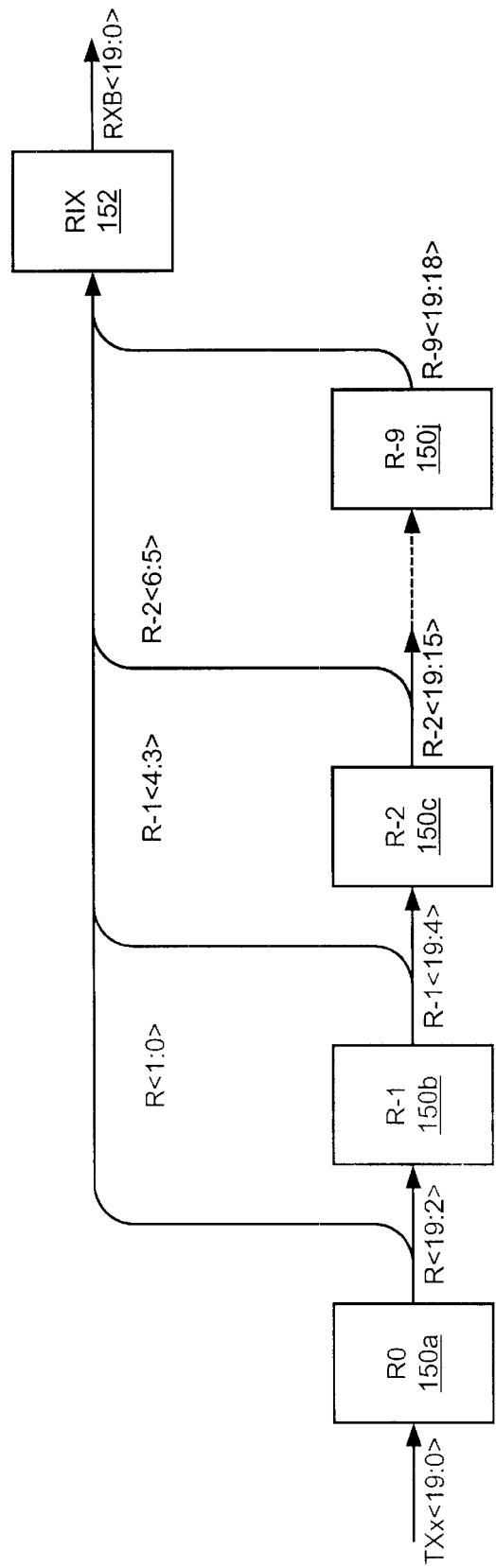
FIG. 9 is another embodiment of burst interleave logic for interleaving each received data word over ten interleaved data words.

Another embodiment of burst interleave logic is illustrated in FIG. 9. The embodiment depicted in FIG. 9 is referred to herein as burst 10 interleave logic. The burst 10 interleave logic interleaves bits of a received data word over ten successive interleaved data words.

More specifically, the burst 10 interleave logic receives extended cipher data words from the framing signal generator 34 as described above in connection with the burst 4 interleave logic and stores the received data words, in register R0 150a. Ten registers denoted R0 150a–R-9 150j are cascaded and commonly clocked. Upon receipt of each successive extended cipher data word, the contents of each register are clocked into the next downstream register and selected bits from each of the registers are coupled to the output register RIX 152.

The transmit equation for the Burst-10 interleave function is given below.

TXx<19:0>=R-9<19>, R-8<17>, R-7<15>, R-6<13>, R-5<11>, R-4<9>, R-3<7>, R-2<5>, R-1<3>, R0<1>, R-9<18>, R-8<16>, R-7<14>, R-6<12>, R-5<10>, R-4<8>, R-3<6>, R-2<4>, R-1<2>, R0<0>

The input data words to the burst 10 interleave logic are depicted in FIG. 10a and the interleaved burst 10 output words appearing at the RIX register 152 output are depicted in FIG. 10b. The mapping of the input bits of the received data words depicted in FIG. 10a over ten sequential data words as illustrated in FIG. 10b defines the burst 10 interleave function.

Burst 10 Word Framing and De-Interleave Logic

Figure 11:
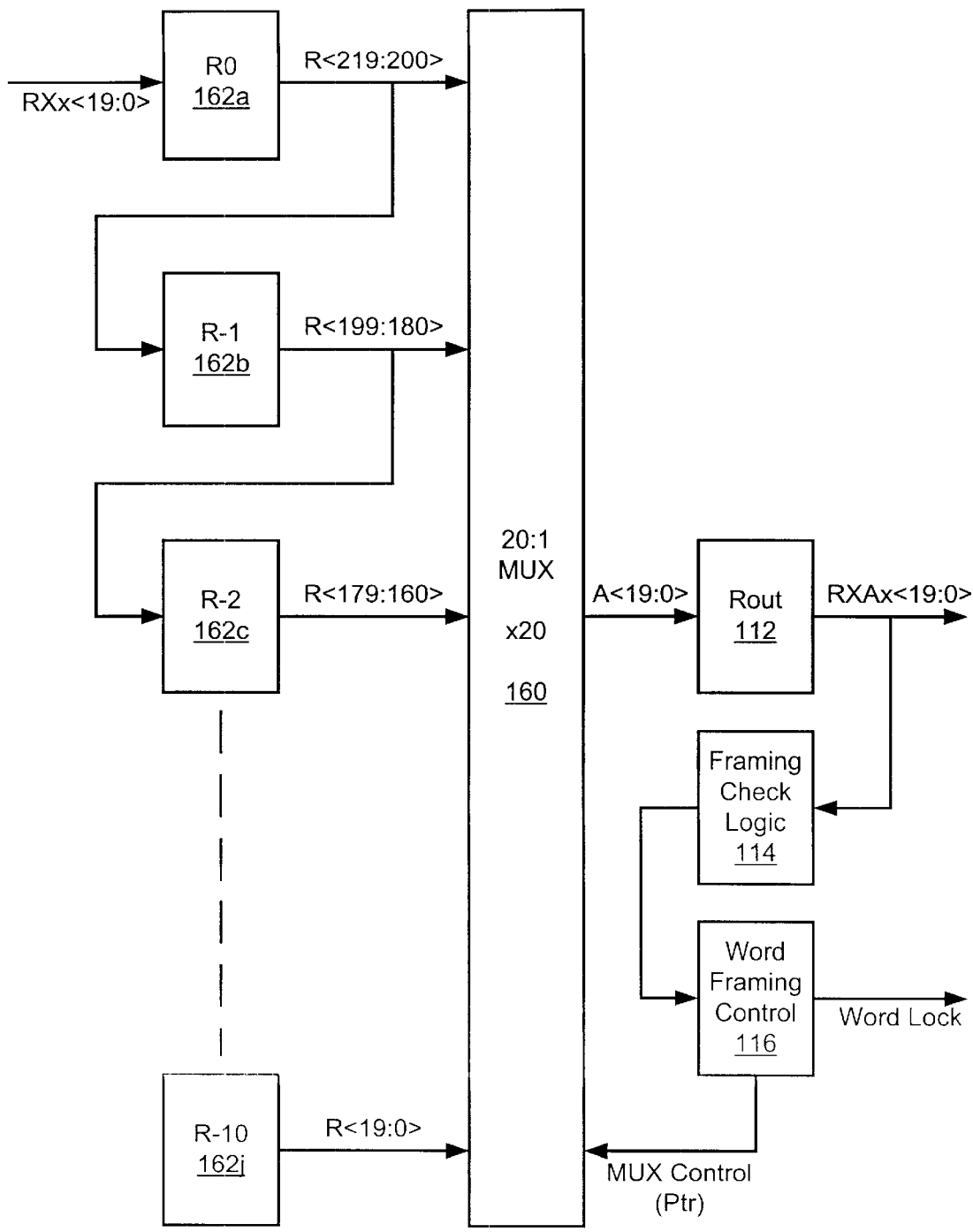
FIG. 11 is a more detailed block diagram illustrating the word framer and de-interleaver logic depicted in FIG. 6 for de-interleaving words interleaved using the logic depicted in FIG. 9.

Referring to FIG. 11, exemplary word framing and de-interleaving logic 90 (FIG. 2) is shown that is configured to perform burst 10 de-interleaving. As shown, the burst 10 word framing and de-interleaving logic includes MUX logic 160 comprising 20 20:1 multiplexers that are employed to select particular bits of eleven cascaded registers R0 162a through R-10 162k based upon the value of the MUX control pointer received from the word framing control logic 116. The operation and use of the register Rout 112, framing check logic 114 and word framing control logic 116 are as described above with respect to the burst 4 word framing and de-interleave logic.

Dynamic Selection Between Burst 4 and Burst 10 Modes

It should be apparent that the burst 10 interleave logic introduces greater delays than the burst 4 interleave logic as a consequence of the need to acquire 10 successive data words in the burst 10 implementation before a data word can be output from the word framing and de-interleave logic. In the burst 4 implementation it is only necessary to acquire four successive data words before a data word can be output from the burst 4 word framing and de-interleaving logic. For this reason it may be desirable in certain applications to switch between the two operational modes based upon measurements of the error rate within the serial data channel 24. If the error rate is below a first predetermined threshold, the system may employ the burst 4 logic and if the error rate is above a second predetermined threshold, the system may employ the burst 10 logic. It should further be appreciated that burst logic for accommodating burst errors of other burst lengths may be employed and the system may dynamically select among the available burst logic based upon the experienced data rates over the respective serial data channel 24 (FIG. 1).

Given the above description, it should be appreciated that the presently described interleave functions may be employed without use of the scrambler and descrambler functions. For example, for purposes of illustration, the words to be interleaved may comprise a data word of any desired width, an EDC or ECC code of width sufficient to provide the level of error detection or correction desired, and a framing signal, such as described above. The width of the extended words to be interleaved will thus vary based on the specific application and the interleave equations will vary accordingly. Additionally, the interleave functions described above may be employed without EDC or ECC codes in the event such is not required. For the 20 bit interleave equations described above, such would permit an 18 bit data word with the use of a 2 bit framing signal or a 19 bit data word with a single bit framing signal. The two-bit framing signal may have a value of 01 for a data block or 10 for a control block as described in the IEEE 802.3ae 10 gigabit per second Ethernet standard with respect to the 64*b*/66*b* code and as known in the art.

Use of Burst Interleave and De-Interleave Logic in a Multi-Channel System

Figure 12:
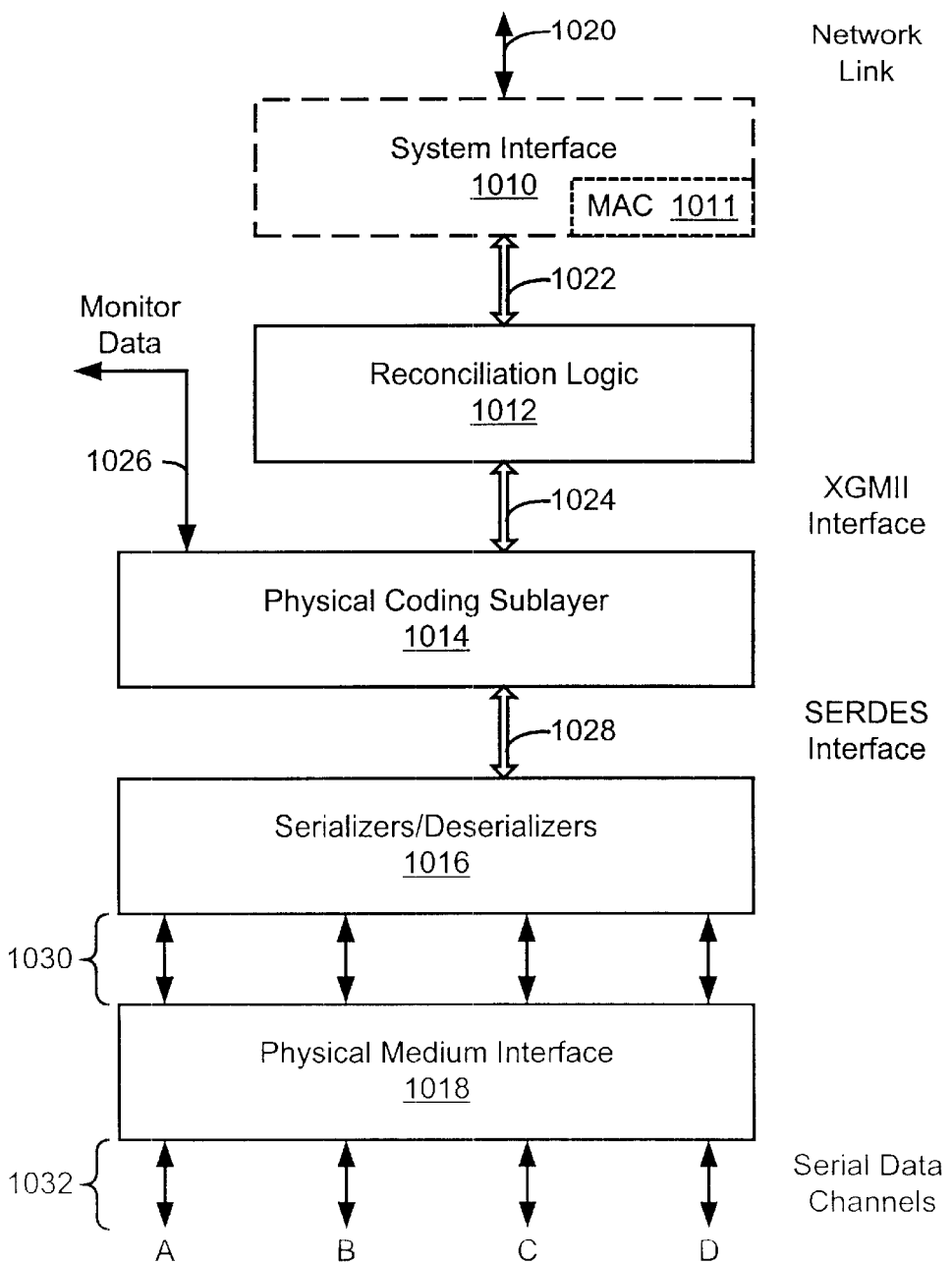
FIG. 12 is a block diagram illustrating a four channel physical coding sublayer that utilizes burst interleave and de-interleave logic to decorrelate data temporally over the respective serial data channels.

It should be further appreciated that the above-described burst interleave and de-interleave logic may be employed in a multi-channel physical coding sub-layer to reduce the susceptability of the system to burst errors that effect the serial data channels. Accordingly, a system is disclosed, along with a physical coding sublayer employed within the system, for communication of data presented in parallel form across multiple serial channels in short haul copper links (such as backplanes and short cable connections), parallel fiber optic links, and wave division multiplexing (WDM) applications (employing fiber optic media). An exemplary system that utilizes the above described burst interleave and de-interleave logic in plural channels is illustrated in FIG. 12. Referring to FIG. 12, the system includes an optional system interface 1010 that may include a media access control (MAC) interface 1011, reconciliation logic 1012, physical coding sublayer logic 1014, serializers/deserializers 1016 and a physical medium interface 1018. The system provides for bidirectional signal transmission and inclues a transmit path in which data moves from the system interface 1010 downward through the various blocks as depicted in FIG. 12 for transmission over a plurality of serial data channels (denoted as Channels A–D). The system also includes a receive path in which data moves from the serial data channels A–D upward as depicted in FIG. 12 through the respective logical blocks. In the illustrated embodiment, along the transmit path information received over a system bus 1020 is converted to media access format within the system interface 1010 by the Media Access Control logic MAC 1011 in accordance with a known MAC protocol such as the ten gigabit Ethernet protocol. The media access control logic is coupled to the reconciliation logic 1012. The reconciliation logic 1012 converts the MAC output to a form that generally comports with the well known XGMII interface 1024. The media access interface may be the same as the XGMII interface in which case the reconciliation logic 1012 may be omitted. The XGMII interface is coupled to the physical coding sublayer logic 1014. A monitor bit from a monitor channel 1026 is also coupled to the physical coding sublayer logic 1014. The information conveyed in the monitor channel is independent of the primary data channel. In the illustrative embodiment, the monitor channel is a 156.25 MB/s full duplex channel and can be employed for the transmission of any control information, management information or data. The physical coding sublayer logic 1014 is operative to (a) receive the monitor channel bit from the monitor channel 1026, (b) generate an error correction code as a function of parallel data received over the XGMII interface 24 and the monitor channel 26 bit, (c) subdivide the received parallel data word, the monitor channel bit and an ECC code generated based upon the monitor bit and the parallel data word into a plurality of lesser width parallel data words, (d) scramble the bits within each of the plurality of lesser width parallel data words using a side-stream scrambler to form cipher data words that are decorrelated in time, (e) generate a control error correction code (CECC) bit that is appended to each of the cipher data words and (f) generate a parity code that is associated with each of the cipher data words and employed in the process of interchannel alignment. The parity bit and the CECC bit together with the scrambled data form an extended width cipher data word. The extended width cipher data words are coupled to serializers within the serializers/deserializers 16 via a serializer/deserializer (SERDES) interface 1028. The serializers convert the extended width cipher data words from parallel to serial form. The serialized extended width cipher data words are coupled to the physical medium interface 1018 over respective serial links 1030. The physical medium interface 1018 drives the respective channels in accordance with the required drive characteristics. More specifically, the physical medium interface 1018 provides the appropriate electrical or electro-optical interface to copper or fiber serial data links 1032, as applicable. By subdividing the wide parallel data word into a plurality of narrower parallel data words, encoding the narrower parallel data words and transmitting data contained in the plurality of narrower encoded parallel data words serially over a corresponding plurality data of serial channels, the number of printed circuit board runs or fiber transmission channels are significantly reduced and an extremely low bit error rate can be achieved. In the case of copper printed circuit board runs, significant space savings on the printed circuit board may be achieved as fewer printed circuit board runs and fewer connector contacts are necessary.

Along the receive path, data moves in the reverse direction from the transmit path. In particular, serialized extended width cipher data words received on serial data channels A–D at the physical medium interface 1018 are converted to the logic levels employed by the deserializers 16. The deserializers 1016 convert the respective serial extended width cipher data words into parallel extended width cipher data words and the parallel extended width cipher data words are coupled to the physical coding sublayer logic 1014 over the SERDES interface 1028. The physical coding sublayer logic 1014 decodes the cipher data words to recreate the original parallel data word at the XGMII interface 1024. The parallel data words are presented to the reconciliation logic 1012, which, in the disclosed embodiment, converts the signaling from that employed on the XGMII interface 1024 to the internal signaling format employed by the MAC. The system interface 1020 supplies data to the system across the system bus. Bus ordering reflects IEEE 802.3 conventions used on the XGMII bus. Within a channel, bit 0 is transmitted on the wire first which is conventional for 1000B-X and Fibre Channel implementations.

On the physical coding sublayer side of the reconciliation logic 1012, the reconciliation logic 1012 interface generally conforms to the XGMII interface 1024. In particular, for the transmit path, the XGMII interface 1024 (FIG. 13) includes a parallel data bus TXX_D<63:0>, a control bus TXX_C<7:0> and a clock TXX_CLK. Along the receive path the XGMII interface includes a parallel data bus RXX_D<63:0>, a control bus RXX_C<7:0> and a receive clock RXX_CLK. The signaling on the XGMII bus 1024 is conventional. A 64-bit implementation of the XGMII is used although the bus signaling definition is independent of width.

Normal Ethernet packets are transmitted over the XGMII bus. The Ethernet packets may start and stop on any byte boundary and require delimiters, along with a series of control characters used to signal the bus state, such as idle or error. All bus states are transmitted on a per-byte basis and are encoded using the control bit and data byte for that specific byte.

Listed below are the byte states used on the XGMII bus.
Data Valid (DV):
Used to indicate a valid byte within an Ethernet packet.
Idle (I):
Used to signal the byte is idle during normal inter-packet gap.
Start of Packet-SOP (S):
Used to signal the beginning of each packet by replacing the first byte of preamble in an Ethernet packet.
End of Packet-EOP (T):
Used to signal the end of each packet by asserting for one byte immediately after the last byte of an Ethernet packet.
Error (E):
Used to signal when an error needs to be forced on the TX bus or when an error is detected by the receive PCS.
These XGMII byte states have the specific bit encoding shown below in Table 1.

TABLE 1

XGMII Control Characters

| Byte State | Control Bit (C) | Data Byte (D) | Description |
| --- | --- | --- | --- |
| DV | 0 | X | Data Valid |
| I | 1 | b00000111 | Idle |
| SOP (S) | 1 | b11111011 | Start of Packet |
| EOP (T) | 1 | b11111101 | End of Packet |
| Error (E) | 1 | b11111110 | Error |

Figure 14:
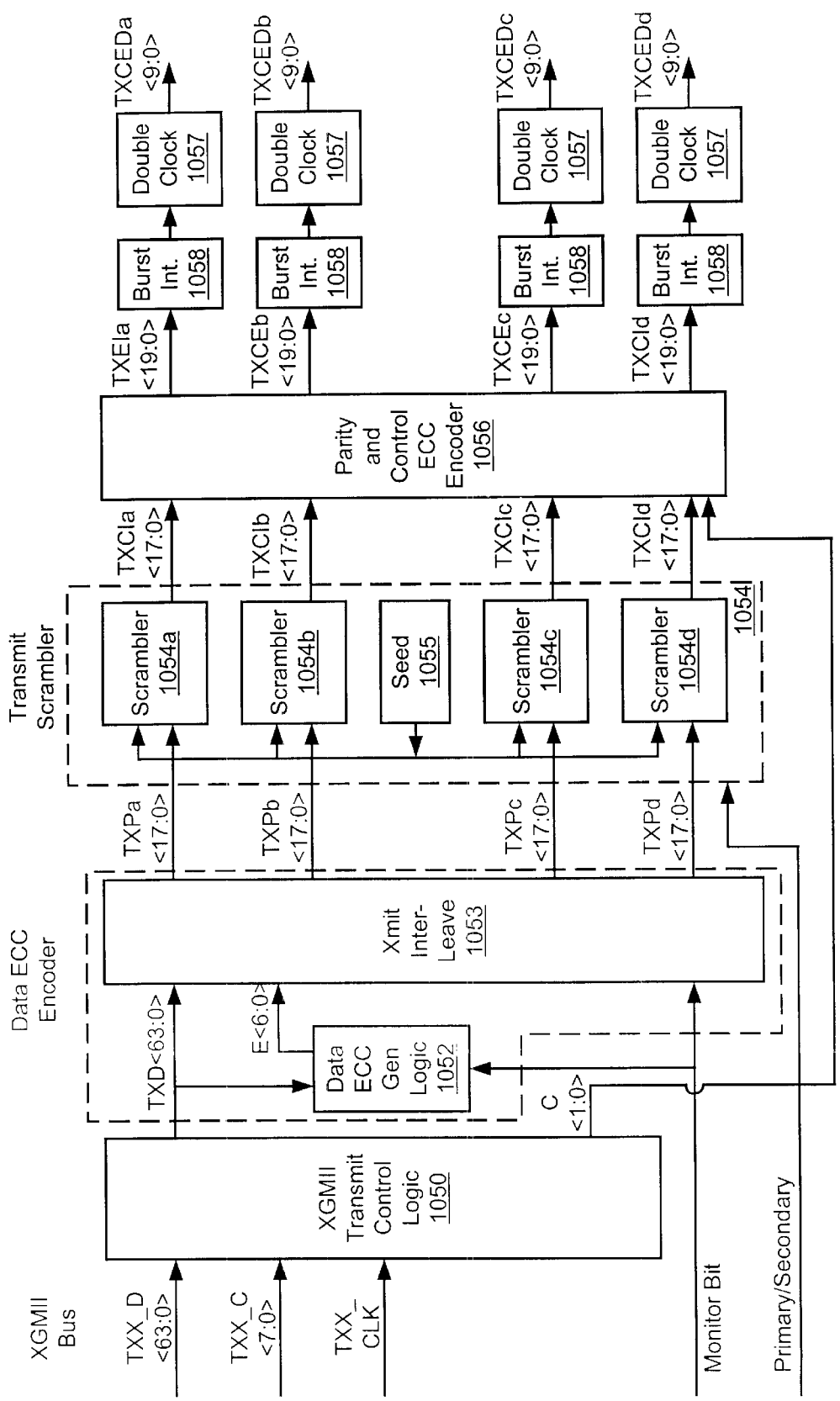
FIG. 14 is a more detailed block diagram of the physical coding sublayer logic depicted in FIG. 12.

The XGMII bus is depicted in FIG. 14. The XGMII bus contains 64 data bits (D6 . . . D0) in each direction which are divided into eight groups, each of eight bits, or a byte. Each of the bytes are accompanied by a control bit (C7 . . . C0). The control bits C7 . . C0 make up the TXX_C<7:0> bus. All the bits are clocked with a source-synchronous clock labeled TXX_CLK.

Figure 13:
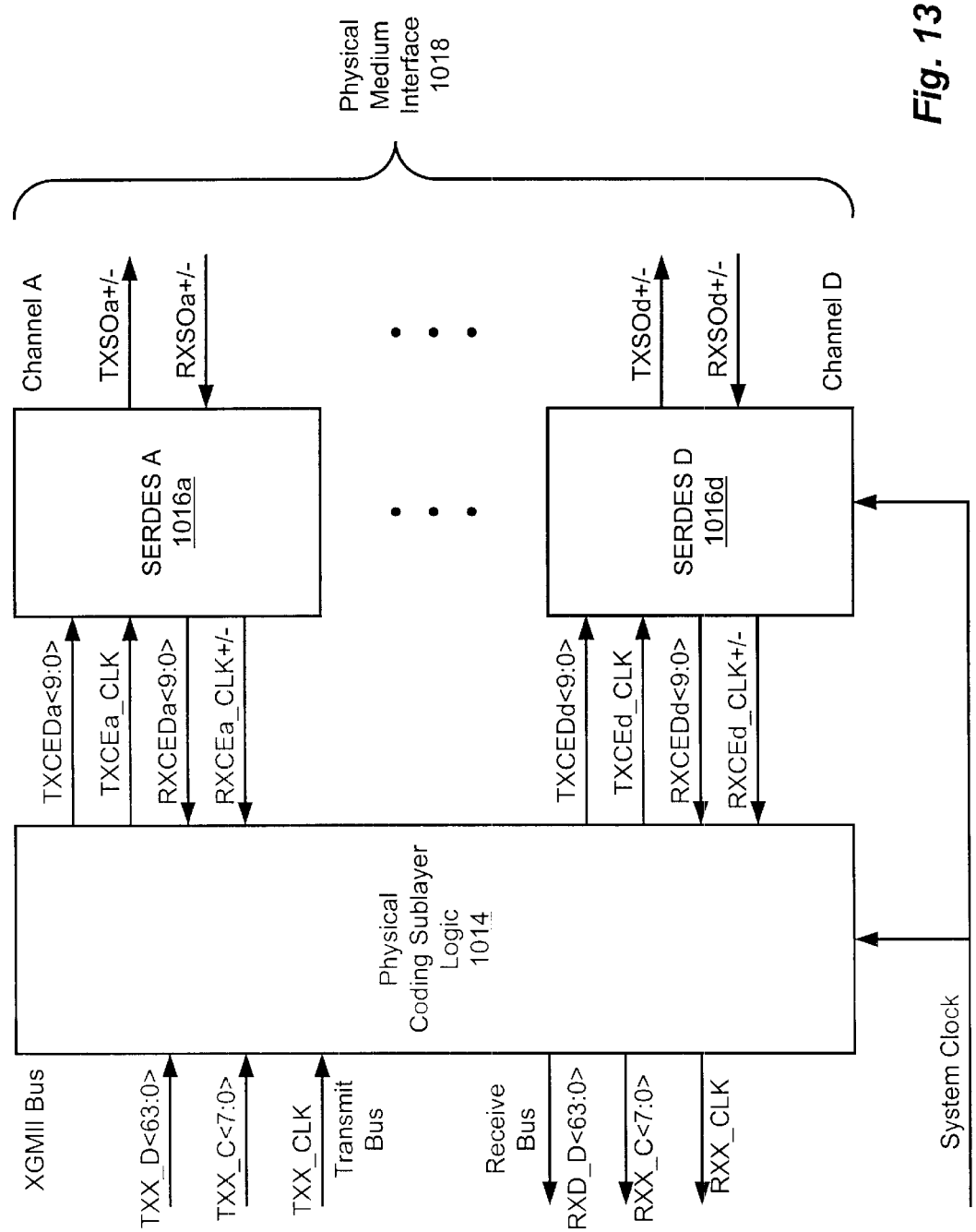
FIG. 13 is a more detailed block diagram illustrating the interfaces for the physical coding sublayer logic and the serializers/de-serializers depicted in FIG. 12.

The interface to the physical coding sublayer logic 1014 and the interfaces for the Serializers/Deserializers 1016 are depicted in FIG. 13. On the reconciliation logic 1012 side of the physical coding sublayer logic 1014, the interface comprises the XGMII interface. The SERDES interface 1028 (FIG. 12) includes signals in the transmit path and signals in the receive path. In the transmit path, the SERDES interface 1028 includes a parallel data bus TXCED<9:0> and a transmit clock TXCE_CLK for each of the respective channels. The data buses in the SERDES interface 1028 for the respective channels in the transmit path are identified as TXCEDa<9:0>, TXCEDb<9:0>, TXCEDc<9:0> and TXCEDd<9:0> for channels A, B, C and D respectively. Transmit clocks TXCEa_CLK, TXCEb_CLK, TXCEc_CLK and TXCEd_CLK are provided for each of the respective channels.

In the receive path, the SERDES interface 1028 includes a parallel data bus RXCED<9:0> and a differential receive clock comprising signals RXCE_CLK+/− for data received over each of the channels A–D. The data buses in the SERDES interface 1028 in the receive path are identified as RXCEDa<9:0>, RXCEDb<9:0>, RXCEDc<9:0> and RXCEDd<9:0> for channels A, B, C and D respectively. Differential clocks signals RXCEa_CLK+/−, RXCEb_CLK+/−, RXCEc_CLK+/− and RXCEd_CLK+/− are provided for each channel in the receive path.

The serializers/deserializers 1016 include a serializer/deserializer for each channel and are identified as SERDES A 1016a, SERDES B 1016b, SERDES C 1016c, and SERDES D 1016d respectively. Each SERDES 1016a through 1016d is coupled to transmit and receive channels as depicted in FIG. 13. In the disclosed embodiment, the serial data transmitted between the SERDES logic 1016 and the Physical Medium Interface 1018 is communicated in differential form. Accordingly, differential drivers and receivers are employed within the SERDES logic 1016 for communication between the SERDES logic 1016 and the Physical Medium Interface 1018. For example, SERDES A 1016a drives differential signals TXSOa+/− along the transmit path and receives differential signals RXSOa+/− along the receive path. The physical coding sublayer 1014 and the Serializers/Deserializers 1016 also receive a system clock or reference clock as illustrated in FIG. 13. The system clock is used by the Serializer as a low jitter reference clock and by the Deserializer to check the frequency of the received serial data.

Exemplary transmit path logic within the physical coding sublayer logic 1014 is depicted in FIG. 14. The use of the presently disclosed physical coding sublayer logic 1014 is particularly beneficial in environments where crosstalk and random noise events are present. Redundancy and a high coding strength are built into the coding to provide extremely low bit error rates. Single bit error correction in both the data and control portions of the code are provided.

Transmit Path Operation

Figure 15:
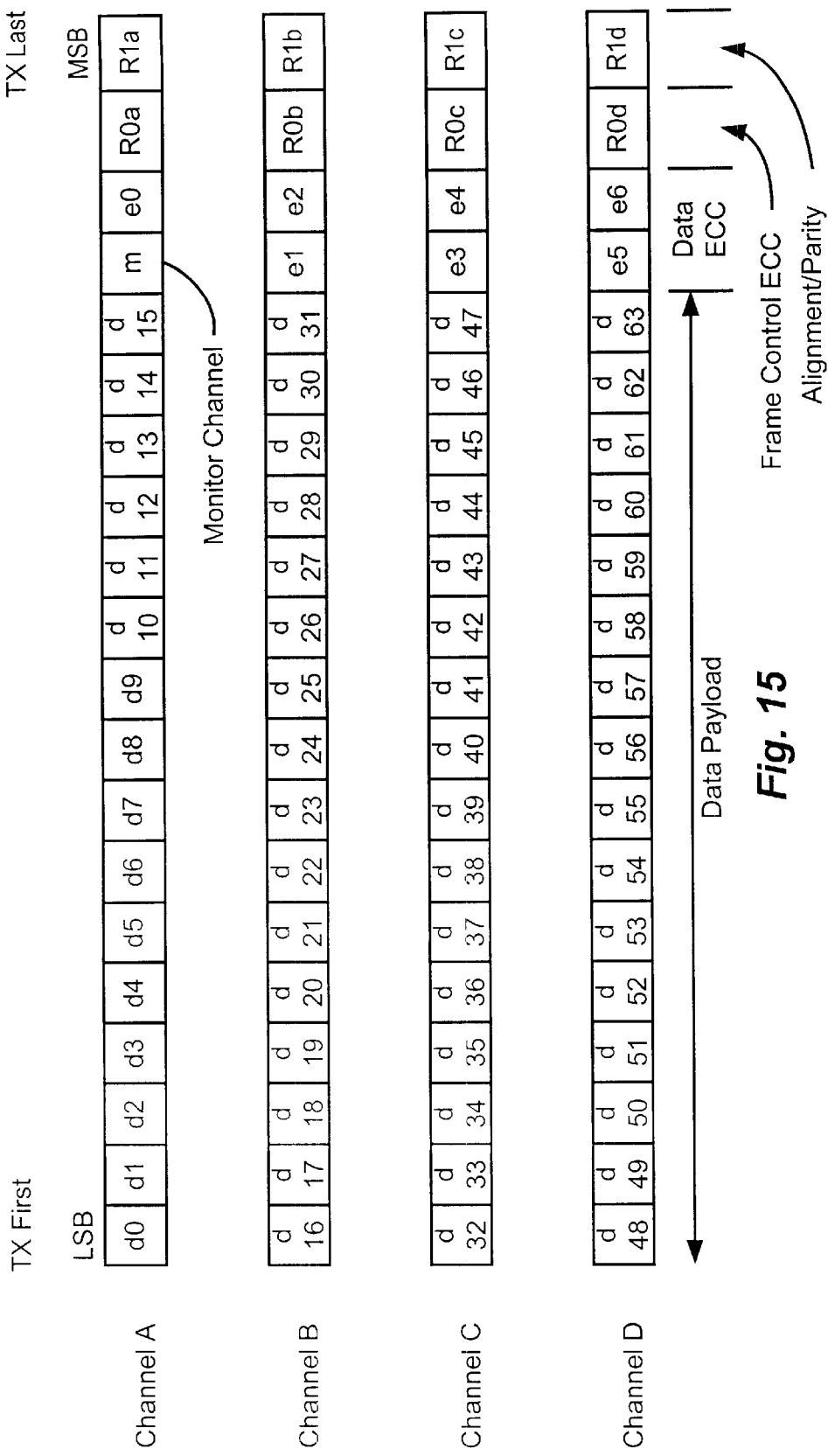
FIG. 15 is an illustrative data structure illustrating an exemplary organization for data transmitted over the four serial data channels depicted in FIG. 12.

The transmit path logic within the physical coding sublayer logic 1014 comprises several logical functions that collectively provide the desired performance while maintaining a pipelined design required for high-speed transmission and low power. More specifically, the transmit path logic within the physical coding sublayer logic 1014 includes an XGMII controller 1050, a data error correction code generator 1052, an interleave function 1053, transmit side-scrambler logic 1054, and a Parity and Control ECC encoder 1056. All these functions are built into a 4×20-bit cell that carries 64 bits of data and framing compatible with Ethernet and cell applications. The 80-bit cell format comprising four 20 bit channels that are output from the physical coding sublayer logic 1014 is illustrated in FIG. 15.

XGMII Transmit Controller

The transmit control block 1050 (FIG. 14) is used to encode XGMII transmit state information into a more compressed format used within the physical coding sublayer logic 1014 transfers. A four-state (two bit) control path C<1:0> is defined along with additional fields in the data payload to transfer the XGMII control state information on 64-bit boundaries. This control coding limits the Inter Packet Gap (IPG) to 8 bytes minimum. The XGMII Transmit Controller 1050 also generates transmit error signals (not shown) in response to XGMII Errors that are signaled across the link and appear as receive errors at the receive PCS. Transmit Error coding is not required per byte (as defined by XGMII) and needs only to be transmitted on a per-frame basis. Transmit Error (TX_ER) is defined as any XGMII Error (E) which occurs within a packet.

The XGMII control information received on the XGMII bus TXX C<7:0> is translated into 4 basic control states.

| | |
|---|---|
| Idle | No data to be transmitted |
| Data Valid all | 64 bits of data to be transmitted |
| Data Valid Low | 1 to 7 bytes of data valid in the low order bytes |
| Data Valid High | 1 to 7 bytes of data valid in the high order bytes |

The control state is encoded within the XGMII transmit Controller 1050 into the two bits, C<1:0>, using the mapping in Table 2.

TABLE 2

Control State Encoding

| C1 | C0 | Control State |
|---|---|---|
| 0 | 0 | Idle |
| 0 | 1 | Data Valid Low |
| 1 | 0 | Data Valid High |
| 1 | 1 | Data Valid All |

C<1:0> and TX_ER define primary control states for the data transfers as shown in Table 3.

TABLE 3

Transmit Data Bus Control Encoding

| C1 | C0 | TX_ER | TXD<63:0> | Description |
|---|---|---|---|---|
| 0 | 0 | 0 | 0x0000000000000000 | Idle |
| 0 | 0 | 1 | Reserved | Idle on medium, reserved communication |
| 1 | 1 | 0 | 0x00.00 to 0xFF..FF | Transmit Data Valid All |
| 0 | 1 | 0 | See Table 3 | Transmit Data Valid Low |
| 1 | 0 | 0 | See Table 4 | Transmit Data Valid High |
| 1 | 1 | 1 | Not defined | Transmit Error |
| 0 | 1 | 1 | Not defined | Transmit Error |
| 1 | 0 | 1 | Not defined | Transmit Error |

Further encoding of valid data bytes is contained within the data bus itself during the Data Valid High and Data Valid Low states. These are shown in Tables 4 and 5.

TABLE 4

Transmit Data Valid Low Encoding

| TXD<63:59> | TXD<58> | TXD<57> | TXD<56> | TXD<55:0> | Description |
|---|---|---|---|---|---|
| Reserved | 0 | 0 | 0 | Reserved | Reserved |
| Reserved | 0 | 0 | 1 | Idle*/Data | 1 byte valid, TXD<7:0> |
| Reserved | 0 | 1 | 0 | Idle*/Data | 2 bytes valid, TXD<15:0> |
| Reserved | 0 | 1 | 1 | Idle*/Data | 3 bytes valid, TXD<23:0> |
| Reserved | 1 | 0 | 0 | Idle*/Data | 4 bytes valid, TXD<31:0> |
| Reserved | 1 | 0 | 1 | Idle*/Data | 5 bytes valid, TXD<39:0> |
| Reserved | 1 | 1 | 0 | Idle*/Data | 6 bytes valid, TXD<47:0> |
| Reserved | 1 | 1 | 1 | Idle*/Data | 7 bytes valid, TXD<55:0> |

*Unused TXD bytes are set to 0x00

TABLE 5

Transmit Data Valid High Encoding

| TXD<7:3> | TXD<2> | TXD<1> | TXD<0> | TXD<55:0> | Description |
|---|---|---|---|---|---|
| Reserved | 0 | 0 | 0 | Reserved | Reserved |
| Reserved | 0 | 0 | 1 | Data/Idle* | 1 byte valid, TXD<63:56> |
| Reserved | 0 | 1 | 0 | Data/Idle* | 2 bytes valid, TXD<63:48> |
| Reserved | 0 | 1 | 1 | Data/Idle* | 3 bytes valid, TXD<63:40> |
| Reserved | 1 | 0 | 0 | Data/Idle* | 4 bytes valid, TXD<63:32> |
| Reserved | 1 | 0 | 1 | Data/Idle* | 5 bytes valid, TXD<63:24> |
| Reserved | 1 | 1 | 0 | Data/Idle* | 6 bytes valid, TXD<63:16> |
| Reserved | 1 | 1 | 1 | Data/Idle* | 7 bytes valid, TXD<63:8> |

*Unused TXD bytes are set to 0x00

Transmit Error (TX_ER) is encoded by the XGMII Transmit Controller as follows.

If the current control state is Idle then no action is taken because the error is not within a packet.

If the current control state is Data Valid Low the control state is sent with the TXD[3] bit set in the reserved control space.

If the current control state is Data Valid High the control state is sent with the TXD[59] bit set in the reserved control space.

If the current control state is Data Valid All the control state is changed to Data Valid High with the TXD[59] bit set in the reserved control space.

Data ECC Encoder

The Data ECC generator 1052 generates seven redundant bits, E<6:0>, from the 65-bit data payload comprising the data carried on TXD<63:0> received from the XGMII Transmit Control Logic 1050 and the monitor channel bit of the monitor channel 1026 (FIG. 12). The seven ECC bits are generated using a CRC algorithm that provides single bit error correction, double bit error detection and six bit burst error detection. Additional error detection capabilities are realized when the CRC detection is combined with the parity protection added later. This is equivalent to most commonly used 8-bit cyclic redundancy checkers that have (1+x) as a factor in the polynomial.

The message polynomial, M(x), is generated from the data and monitor transmit payload, TXD<63:0> and the monitor bit M, using the convention that the highest polynomial term is the first bit on the wire.

$$M(x)=TXD0x^{64}+TXD1x^{63}+\ldots+TXD62x^2+TXD63x+M$$

The message polynomial is then divided by the generating polynomial, G(x), to produce the quotient, Q(x), and the remainder, E(x).

$$\frac{x^7 M(x)}{G(x)} = Q(x) + \frac{E(x)}{G(x)}$$

where E(x) has the form $$E(x)=E0x^6+E1x^5+\ldots+E5x+E6$$

The transmit message is then the concatenation of the message, M(x), and the remainder, E(x).

$$TX(x)=M(x)+E(x)$$

This 72 bit payload is then inserted in the physical coding sublayer cell format depicted in FIG. 15 and has the property that it is divisible by G(x) in the absence of errors.

The generating polynomial, G(x), in the preferred embodiment, was chosen to minimize the number of gates in the implementation.

$$G(x)=x^7+x+1$$

Shown below are the reduced XOR logical equations that constitute the CRC function within the data ECC generator 1052 for the exemplary embodiment herein disclosed.

E0=TXD2+TXD5+TXD9+

TXD10+TXD11+TXD16+TXD18+TXD19+

TXD20+TXD21+TXD22+TXD25+TXD27+

TXD29+TXD30+TXD31+TXD34+TXD35+

TXD37+TXD41+TXD44+TXD45+TXD46+

TXD47+TXD51+TXD53+TXD58+TXD59;

E1=TXD0+TXD3+TXD6+TXD10+

TXD11+TXD12+TXD17+TXD19+TXD20+

TXD21+TXD22+TXD23+TXD26+TXD28+

TXD30+TXD31+TXD32+TXD35+TXD36+

TXD38+TXD42+TXD45+TXD46+TXD47+

TXD48+TXD52+TXD54+TXD59+TXD60;

E2=TXD0+TXD1+TXD4+TXD7+

TXD11+TXD12+TXD13+TXD18+TXD20+

TXD21+TXD22+TXD23+TXD24+TXD27+

TXD29+TXD31+TXD32+TXD33+TXD36+

TXD37+TXD39+TXD43+TXD46+TXD47+

TXD48+TXD49+TXD53+TXD55+TXD60+

TXD61;

E3=TXD1+TXD2+TXD5+TXD8+

TXD12+TXD13+TXD14+TXD19+TXD21+

TXD22+TXD23+TXD24+TXD25+TXD28+

TXD30+TXD32+TXD33+TXD34+TXD37+

TXD38+TXD40+TXD44+TXD47+TXD48+

TXD49+TXD50+TXD54+TXD56+TXD61+TXD62;

E4=TXD0+TXD2+TXD3+TXD6+

TXD9+TXD13+TXD14+TXD15+TXD20+

TXD22+TXD23+TXD24+TXD25+TXD26+

TXD29+TXD31+TXD33+TXD34+TXD35+

TXD38+TXD39+TXD41+TXD45+TXD48+

TXD49+TXD50+TXD51+TXD55+TXD57+

TXD62+TXD63;

E5=TXD0+TXD1+TXD3+TXD4+

TXD7+TXD10+TXD14+TXD15+TXD16+

TXD21+TXD23+TXD24+TXD25+TXD26+

TXD27+TXD30+TXD32+TXD34+TXD35+

TXD36+TXD39+TXD40+TXD42+TXD46+

TXD49+TXD50+TXD51+TXD52+TXD56+

TXD58+TXD63+M;

E6=TXD1+TXD4+TXD8+TXD9+

TXD10+TXD15+TXD17+TXD18+TXD19+

TXD20+TXD21+TXD24+TXD26+TXD28+

TXD29+TXD30+TXD33+TXD34+TXD36+

TXD40+TXD43+TXD44+TXD45+TXD46+

TXD50+TXD52+TXD57+TXD58+M;

Transmit Channel Assignments

The transmit data bus, monitor bit and ECC bits are divided into separate groups which are then scrambled as subsequently described and transmitted over respective channels. In the present embodiment, the 64 data bits comprising the parallel input data word, the monitor bit and the seven (7) ECC bits comprise 72 bits that are split into four 18 bit groups as indicated below. This is the function of the transmit interleaver 1053. This interleaver may comprise active logic to drive respective signals or alternatively may simply define the coupling of appropriate outputs TXD<63:0>, E<6:0> and M to the appropriate inputs of the transmit scrambler logic 54 as defined below.

TXPa<17:0>=<E0, M, TXD15, TXD14, TXD13, TXD12, TXD11, TXD10, TXD9, TXD8, TXD7, TXD6, TXD5, TXD4, TXD3, TXD2, TXD1, TXD0>

TXPb<17:0>=<E2, E1, TXD31, TXD30, TXD29, TXD28, TXD27, TXD26, TXD25, TXD24, TXD23, TXD22, TXD21, TXD20, TXD19, TXD18, TXD17, TXD16>

TXPC<17:0>=<E4, E3, TXD47, TXD46, TXD45, TXD44, TXD43, TXD42, TXD41, TXD40, TXD39, TXD38, TXD37, TXD36, TXD35, TXD34, TXD33, TXD32>

TXPd<17:0>=<E6, E5, TXD63, TXD62, TXD61, TXD60, TXD59, TXD58, TXD57, TXD56, TXD55, TXD54, TXD53, TXD52, TXD51, TXD50, TXD49, TXD48>

Transmit Scrambler

Transmit scrambler 1054 is used to provide DC balance, insert transitions, spread the signal spectrum across the available bandwidth and produce low EMI. The incoming data is exclusive ORed with the scrambler's PRBS.

Each channel has a separate side-stream scrambler 1054a, 1054b, 1054c and 1054d, which is generating the same sequence, but offset in time, so the channels are de-correlated locally in time. The side stream scramblers 1054 correspond to the side stream scramblers 32 previously discussed and illustrated in FIG. 3. In a preferred embodiment, de-correlation is achieved over +/−2.6 us using a pseudo random binary sequence of length 15, which is sufficient to de-correlate Near End Crosstalk (NEXT) and Far End Crosstalk (FEXT) contributions from other channels. The time offset of the sequences in the respective channels is achieved by loading different seed values in each channel at startup. Separate scramblers are used to keep global interconnect low while providing a scalable structure. Alternatively, a centralized scrambler may be employed.

Offset scramblers also effectively encode channel skew information into the transmission words that could be used by the receiver to establish inter-channel skew. The cell encoder uses a more direct method of establishing inter-channel alignment so checking this relationship within the receiver is optional.

In the illustrated embodiment, a pseudo random binary sequence of length 15 (PRBS15) was chosen to allow receiver synchronization within one Idle transmission period. Data in each channel is defined to be constant at 0x00 during an idle transmission. The monitor bit, and, consequently, the error correction bits, E5 and E6 bits, are not guaranteed to have a known state during idle. The first 15 bits within each channel, i.e. TXCx <14:0>, give the state of the scrambler so the 15 bit seed can be recovered completely within each 80-bit idle cell. Each of the scramblers 1054a, 1054b, 1054c, 1054d (FIG. 14) employs the logic depicted in FIG. 3 in a preferred embodiment.

The outputs of the respective side scramblers provide scrambled or cipher data that are identified as TXCIa<17:0>, TXCIb<17:0>, TXCIc<17:0> and TXCId<17:0> as indicated above. The side scrambler output buses are coupled to the inputs of a Parity and FEC Control Matrix 1056 (FIG. 14) which is depicted with greater particularity in FIG. 16.

Parity and Control FEC Matrix

Figure 16:
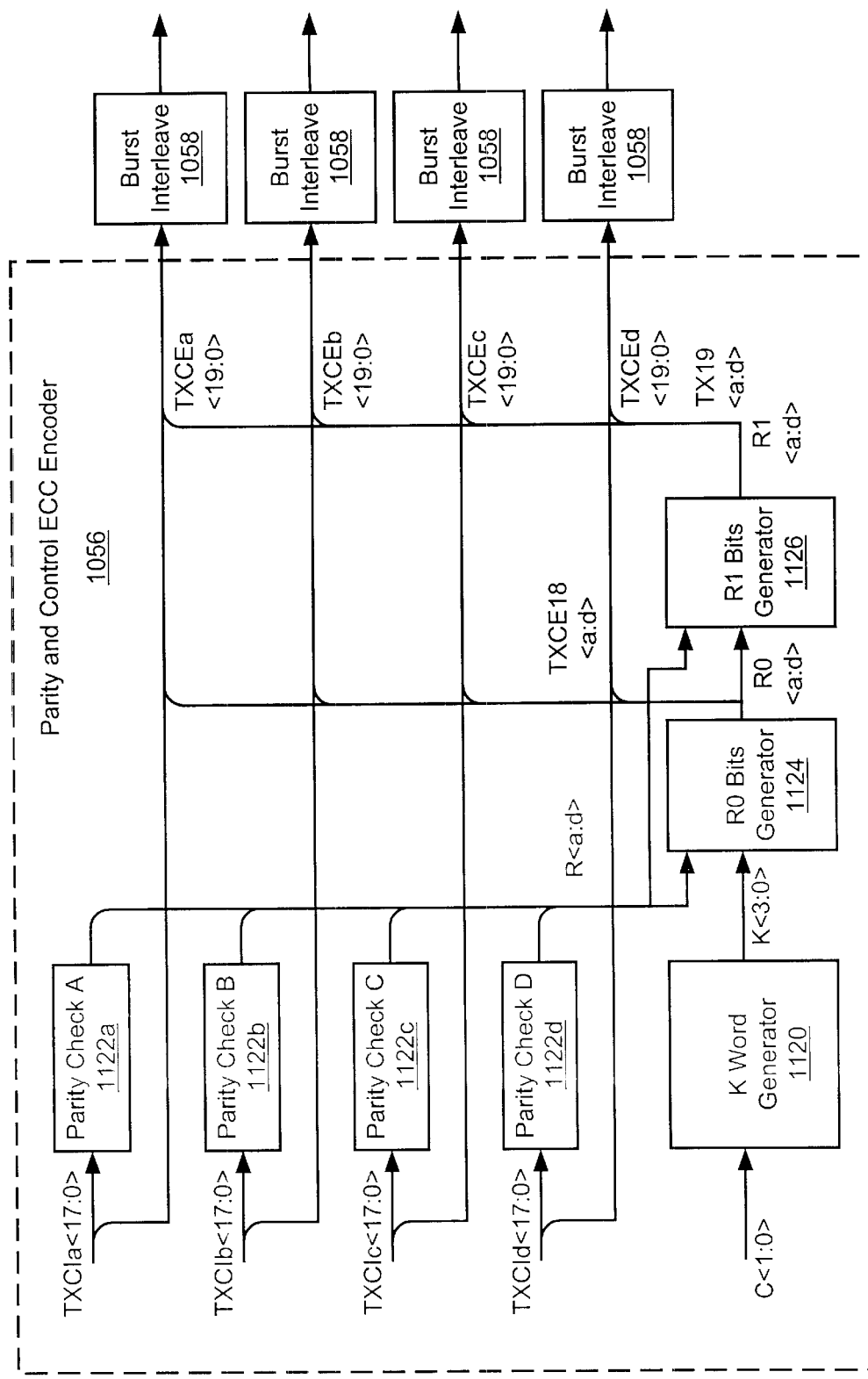
FIG. 16 is a more detailed block diagram depicting exemplary parity and control ECC encoder logic of FIG. 14.

Referring to FIG. 16, the Parity and Control ECC Logic 1056 generates two additional bits in each channel. The two bits per channel carry transmit control state and provide parity for the respective channels. The bits are used to obtain alignment on word boundaries within each channel (word alignment) and additionally to obtain inter-channel alignment. These added bits are redundant with a Hamming distance of 4 to allow correction of single bit control errors and detection of two-bit errors. The inputs to the parity and control ECC encoder 1056 comprise the control bus c<1:0> and the TXCI bus data from the scramblers 1054a–1054d (FIG. 14). The parity and Control ECC encoder 1056 generates extended cipher data words TXCEa<19:0> through TXCEd<19:0> (FIG. 16) that are coupled to burst interleave logic 1058, such as the burst 4 interleave logic or the burst 10 interleave logic described above (FIGS. 4, 5a, 5b and accompanying description, FIGS. 9, 10a, 10b and accompanying description). The outputs of the burst interleave logic 1058 are coupled to double clock logic 1057 (FIG. 14). The double clock logic 1057 clocks out the 20 bit per channel TXCE data as two sequential 10 bit words TXCED<9:0> to reduce the number of signal lines that need to be accommodated within the system.

The first of the two parity bits previously identified as the CECC bit and referred to in the drawing as the R0 bit, starts with the definition of a new variable, K<3:0> in a K word generator 1120. The K word generator 1120 receives as an input the control word C<1:0> from the XGMII Transmit Control Logic 1050. The output of the K word generator 1120 comprises a four bit wide bus K<3:0> that holds the control state redundantly and has zero DC content. The states themselves have a minimum Hamming distance of 2 and require the additional information from the parity bits R1 discussed below to increase the Hamming distance to 4 and allow correction to be performed. The generation of the K values based upon the C<1:0> inputs is illustrated below in Table 6.

TABLE 6

| Control State | | Coding Output | | | |
|---|---|---|---|---|---|
| C1 | C0 | K3 | K2 | K1 | K0 |
| 0 | 0 | 1 | 1 | 0 | 0 |
| 0 | 1 | 1 | 0 | 0 | 1 |
| 1 | 0 | 0 | 1 | 1 | 0 |
| 1 | 1 | 0 | 0 | 1 | 1 |

Control Word Output

Intermediate parity checks, R<a:d>, are calculated on the 72-bit TXCI data payload (data+Monitor+data EVC) in parity check logic 1122a, 1122b, 1122c and 1122d as follows:

$$R_a = \sum_{k=0}^{17} TXCI_a(k)$$

$$R_b = \sum_{k=0}^{17} TXCI_b(k)$$

$$R_c = \sum_{k=0}^{17} TXCI_c(k)$$

$$R_d = \sum_{k=0}^{17} TXCI_d(k)$$

Thus, Ra indicates the parity of the data contained in TXCIa<17:0>, Rb indicates the parity of the data contained in TXCIb<17:0>, Rc indicates the parity of the data contained in TXCIc<17:0> and Rd indicates the parity of the data contained in TXCId<17:0>. The parity check variables are random if the TXCI payload is random, which will be the case due to the use of side-stream scramblers 1054a, 1054b, 1054c and 1054d. The intermediate parity bits Ra, Rb, Rc and Rd are XORed with the K bits in R0 bit generation logic 1124 to scramble the control state and the R0 bits are further rotated across the channels to permit inter-channel skew detection. The resulting R0<a:d> bits are transmitted as the TXCE18<a:d> bits in each channel and are defined as follows.

$$TXCE18_a = R0_a = R_d + K0$$

$$TXCE18_b = R0_b = R_a + K1$$

$$TXCE18_c = R0_c = R_b + K2$$

$$TXCE18_d = R0_d = R_c + K3$$

Finally, the overall parity across all 19 bits in each channel is calculated in R1 bit generation logic 1126 and transmitted in the TXCE19<a:d> slot as illustrated in FIG. 15. These bits are designated as the R1<a:d> bits and calculated as indicated below.

$$TXCE19_a = R1_a = !\sum_{k=0}^{18} TXC_a(k) = !(R_a + R0_a)$$

$$TXCE19_b = R1_b = !\sum_{k=0}^{18} TXC_b(k) = !(R_b + R0_b)$$

$$TXCE19_c = R1_c = !\sum_{k=0}^{18} TXC_c(k) = !(R_c + R0_c)$$

$$TXCE19_d = R1_d = !\sum_{k=0}^{18} TXC_d(k) = !(R_d + R0_d)$$

! indicates inversion

The R1<a:d> (TXCE19) bits are used as parity bits to enhance error correction and detection in both the data and control payloads. They also provide correlation information to allow word and channel alignment to be achieved as discussed further below. Inversion of the parity guarantees at least one transition within the 20-bit word. Two worst case words back to back can produce the maximum run length of 38 with a probability of 3.6E-12.

Within each channel all bits in a word sum to one in the absence of any errors. This characteristic is used to acquire word alignment and can be employed as the framing signal by the framing signal logic 114 (FIGS. 7 and/or 11) as discussed above.

$$\sum_{k=0}^{19} TX_a(k) = 1$$

$$\sum_{k=0}^{19} TX_b(k) = 1$$

$$\sum_{k=0}^{18} TX_c(k) = 1$$

$$\sum_{k=0}^{18} TX_d(k) = 1$$

Additionally, when the channels are correctly aligned all R1 bits within a cell sum to zero in the absence of errors.

$$TXCE19_a + TXCE19_b + TXCE19_d + TXCE19_d = 0$$

$$R1_a + R1_b + R1_d + R1_d = 0$$

This is used to achieve channel alignment as discussed below.

Receive Path

Figure 17:
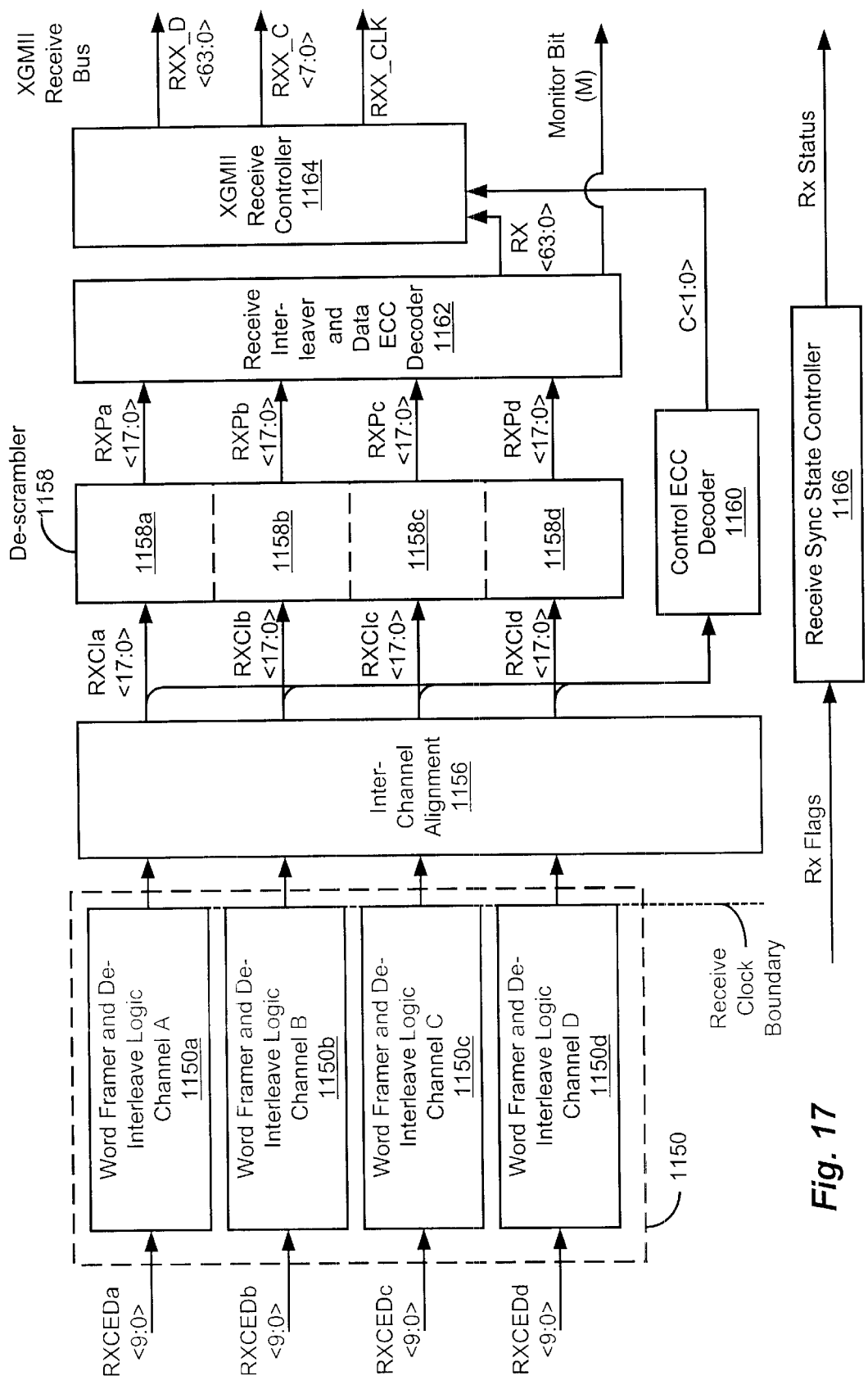
FIG. 17 is a more detailed block diagram depicting word framing logic, inter-channel alignment logic, descrambler logic, de-interleaving and data ECC decoder logic employed within the receive logic of the physical coding sublayer logic.

The receive path through the physical coding sublayer 1014 is depicted in FIG. 17. Referring to FIG. 17, the receive path roughly follows the transmit path in reverse with the added complexity of having to acquire word and inter-channel alignment and perform error correction.

Channels A, B, C and D include channel receive logic that includes word framer and de-interleave logic 1150a–d (FIG. 17). Each block 1150a–d includes one instance of the word framer and de-interleave logic for the burst 4 logic, the burst 10 logic or both. The respective word framer and de-interleave logic functions 1150a–d receive parallel data over buses RXCEDa<9:0>–RXCEDd<9:0>. The outputs of the word framer and de-interleave logic 1150a–d are coupled to inter-channel alignment logic 1156 which in turn has outputs that are coupled to a de-scrambler 1158 such as discussed above with respect to FIG. 8 and a control ECC Decoder 1160. The outputs from the de-scrambler 1158 are coupled to receive interleave and data ECC decode logic 1162. The outputs from receive interleave and data ECC logic 1162 and the control ECC decode logic 1160 are coupled to the XGMII receive controller 1164. The XGMII receive controller 1164 produces at its output the original parallel data word on the bus RXX_D<63:0>, the original control byte on bus RXX_C<7:0> and a receive clock RXX_CLK. The receive interleave and data ECC logic 1162 also provides as an output the bit M of the monitor channel as depicted in FIG. 17.

Alignment of receive data is achieved in several steps. Each step is dependent on acquisition of the previous steps. Acquisition starts with achieving word-frame alignment within each channel. Word frame alignment is achieved as discussed above with respect to FIG. 7. The channels are then de-skewed to achieve inter-channel alignment and finally the scrambler states are acquired during an idle transmission. Receive channels are synchronous but do not have a defined phase at the input to the receiver after de-serialization. All channels are synchronized to a master channel that in the present embodiment is defined to be channel A. Inter-channel alignment is accomplished in the inter-channel alignment block 1156. The inter-channel alignment block 1156 includes a FIFO structure in the respective channels to permit the changing of clock domains.

The bit error rate (BER) during acquisition is assumed to be reasonably good (better than 1E-6) such that there is a high probability that correlation calculations done over 256 words will not experience an error.

Word Frame Alignment

Figure 18:
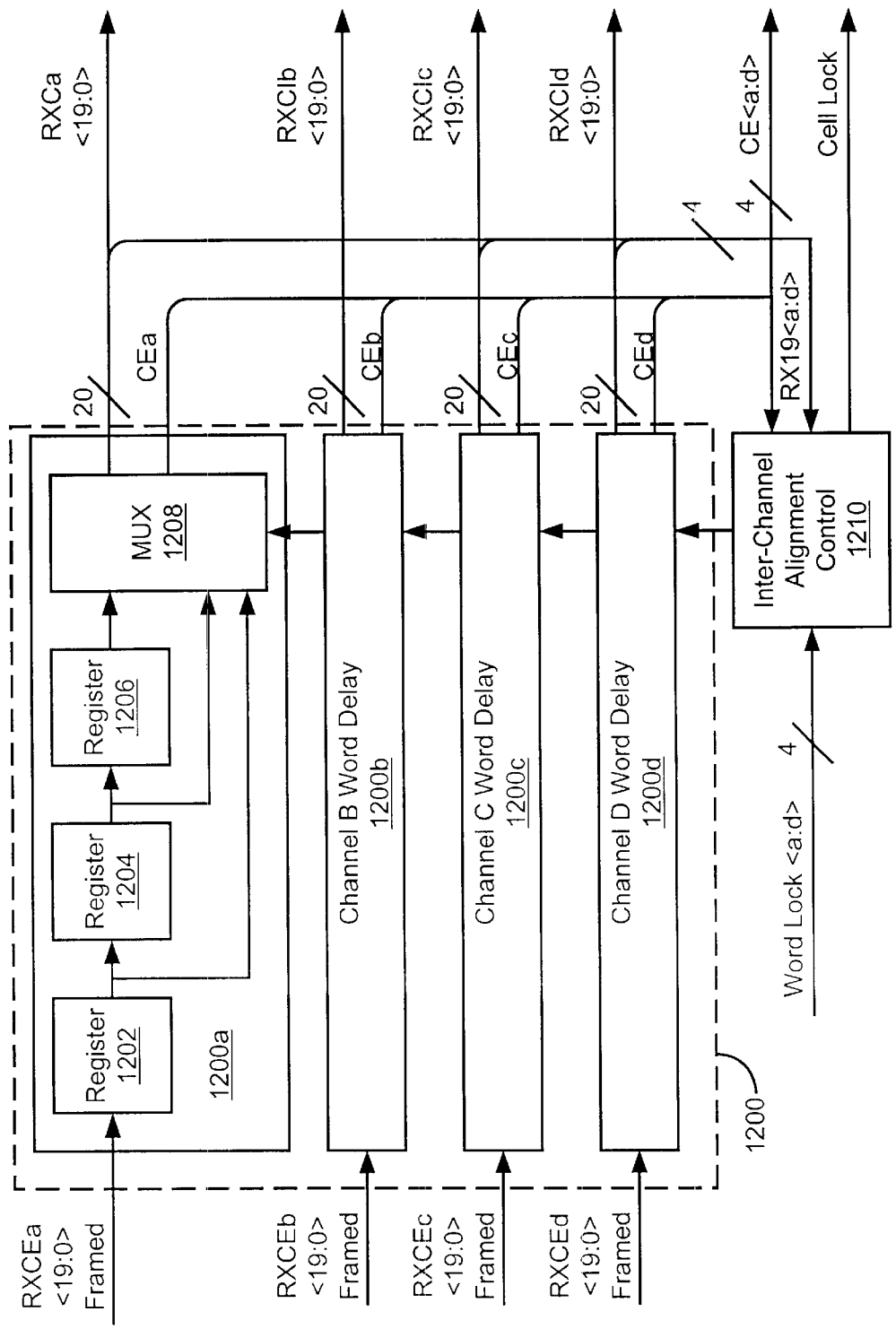
FIG. 18 is a more detailed block diagram depicting exemplary inter-channel alignment logic of FIG. 17.

Word framing logic that may be employed in each of the receive channels is depicted with greater particularity in FIG. 18. Word framing within each channel of the presently illustrated four channel system is obtained by checking for correct parity across a word (20 bits). More particularly, word framing logic such as illustrated and discussed with respect to 7 and 11 is employed to achieve word frame alignment. In the present case, the frame check logic 112 (FIGS. 7, 11) checks for proper parity across a predetermined number of word samples.

The parity calculation is done over 20 receive bits to produce the Channel Error (CE) variable.

$$CE(n) = !\sum_{k=0}^{19} RX(k) = 0$$

Each CE bit has roughly a 50% chance of being correct (=0) in a random data stream. Integrating over N samples gives the required low probability of false alignment.

$$\sum_{n=0}^{N} CE(n) = 0$$

The probability of false alignment is 3E-39 if the calculation is done over 128 words (N=128) and 9E-78 over 256 words (N=256) with random data.

The Word Frame Control logic 116 (FIGS. 7, 11) uses the output of the Framing Check Logic 114 (FIGS. 7, 11) to search through the 20 possible framing options until the correct frame location is acquired. In the present circumstance, the Framing Check Logic 114 comprises logic for varying the received parity indication. More specifically, as indicated above, the framing check logic 114 inspects the 20 bit frame a presented and provides an indication of no error if CE(n)=0 and provides an indication of a channel error if CE(n)=1. The word frame control logic 116 (FIGS. 7, 11) provides an output signal Word Lock once proper word framing has been achieved. Correct word framing is virtually assured by confirming correct parity over a large number of samples, such as 128 or 256 samples.

Receiver Inter-Channel Alignment

FIG. 18 depicts an exemplary block diagram for achieving inter-channel alignment of received parallel data words. Inter-channel alignment is needed to avoid the possibility of word skew between the respective serial channels. Once word framing is achieved in all channels and the R1 bits (RX19) have been identified in each channel, inter-channel alignment can proceed. Inter-channel alignment relies on the property that the R1 parity bits sum to zero if the channels are correctly aligned (in the absence of errors).

$$A(n) = R1_a + R1_b + R1_c + R1_d = 0$$

The A bit has a roughly 50% chance of being correct (=0) in a random data stream. Integrating over N samples gives the required low probability of false alignment.

$$\sum_{n=0}^{N} A(n) = 0$$

The probability of false alignment is 3E-39 if the calculation is done over 128 words (N=128) and 9E-78 over 256 words (N=256) with random data.

Inter-Channel alignment can be achieved by delaying specific channels relative to other channels. Referring to FIG. 18 each channel contains word delay logic 1200. The delay logic 1200 in the presently disclosed embodiment includes cascaded delay registers 1202, 1204, 1206 and a MUX 1208 that selects one of the progressively delayed versions of the receive words. The number of delay stages required is a function of the possible skew that may occur during transmission through the channel and is system dependent. The implementation in FIG. 18 allows for an inter-channel skew of +/−1 word. A greater number of cascaded delay registers may be employed. The multiplexer 1208 in each channel can select the appropriate delayed word as the operative input to the MUX 1208. The Inter-Channel Alignment Control logic 1210 adjusts the delays until the R1 bits across the four channels sum to 0 over a predetermined number of samples.

The FIFO structure of the inter-channel alignment block lends itself to re-synchronizing the B, C and D receive clocks into the channel A clock domain. The FIFOs can be initialized after word alignment has been achieved in each channel, which guarantees an acceptable BER in each channel and the link is operating in a steady state with no phase gradients caused by the phase locked loops (PLLs).

The search pattern used to acquire inter-channel alignment is somewhat arbitrary however the highest probability of achieving alignment is around the equal delay point across channels. Searching around this point can minimize acquisition time. Table 7 shows a weighted-search over +/−1 word. Executing the search in Table 8 after Table 7 will achieve a weighted-search over +/−2 words.

Channel A is used as the delay reference (always 0) and negative numbers indicate that channel is advanced relative to channel A while positive numbers indicate they are retarded in Tables 7 and 8.

TABLE 7

Channel Alignment Search +/− One Word

| Iteration | A | B | C | D |
|---|---|---|---|---|
| 1 | 0 | 0 | 0 | 0 |
| 2 | 0 | −1 | 0 | 0 |
| 3 | 0 | 0 | −1 | 0 |
| 4 | 0 | 0 | 0 | −1 |
| 5 | 0 | 0 | 0 | 1 |
| 6 | 0 | 0 | 1 | 0 |
| 7 | 0 | 1 | 0 | 0 |
| 8 | 0 | −1 | −1 | 0 |
| 9 | 0 | −1 | 0 | −1 |
| 10 | 0 | −1 | 0 | 1 |
| 11 | 0 | −1 | 1 | 0 |
| 12 | 0 | 0 | −1 | −1 |
| 13 | 0 | 0 | −1 | 1 |
| 14 | 0 | 0 | 1 | −1 |
| 15 | 0 | 0 | 1 | 1 |
| 16 | 0 | 1 | −1 | 0 |
| 17 | 0 | 1 | 0 | −1 |
| 18 | 0 | 1 | 0 | 1 |
| 19 | 0 | 1 | 1 | 0 |
| 20 | 0 | −1 | −1 | −1 |
| 21 | 0 | −1 | −1 | 1 |
| 22 | 0 | −1 | 1 | −1 |
| 23 | 0 | −1 | 1 | 1 |
| 24 | 0 | 1 | −1 | −1 |
| 25 | 0 | 1 | −1 | 1 |
| 26 | 0 | 1 | 1 | −1 |
| 27 | 0 | 1 | 1 | 1 |

TABLE 8

Channel Alignment Search +/− Two Words

| Iteration | A | B | C | D |
|---|---|---|---|---|
| 28 | 0 | −2 | 0 | 0 |
| 29 | 0 | 0 | −2 | 0 |
| 30 | 0 | 0 | 0 | −2 |
| 31 | 0 | 0 | 0 | 2 |
| 32 | 0 | 0 | 2 | 0 |
| 33 | 0 | 2 | 0 | 0 |
| 34 | 0 | −2 | −1 | 0 |
| 35 | 0 | −2 | 0 | −1 |
| 36 | 0 | −2 | 0 | 1 |
| 37 | 0 | −2 | 1 | 0 |
| 38 | 0 | −1 | −2 | 0 |
| 39 | 0 | −1 | 0 | −2 |
| 40 | 0 | −1 | 0 | 2 |
| 41 | 0 | −1 | 2 | 0 |
| 42 | 0 | 0 | −2 | −1 |
| 43 | 0 | 0 | −2 | 1 |
| 44 | 0 | 0 | −1 | −2 |
| 45 | 0 | 0 | −1 | 2 |
| 46 | 0 | 0 | 1 | −2 |
| 47 | 0 | 0 | 1 | 2 |
| 48 | 0 | 0 | 2 | −1 |
| 49 | 0 | 0 | 2 | 1 |
| 50 | 0 | 1 | −2 | 0 |
| 51 | 0 | 1 | 0 | −2 |
| 52 | 0 | 1 | 0 | 2 |
| 53 | 0 | 1 | 2 | 0 |
| 54 | 0 | 2 | −1 | 0 |
| 55 | 0 | 2 | 0 | −1 |
| 56 | 0 | 2 | 0 | 1 |
| 57 | 0 | 2 | 1 | 0 |
| 58 | 0 | −2 | −1 | −1 |
| 59 | 0 | −2 | −1 | 1 |
| 60 | 0 | −2 | 1 | −1 |
| 61 | 0 | −2 | 1 | 1 |
| 62 | 0 | −1 | −2 | −1 |
| 63 | 0 | −1 | −2 | 1 |
| 64 | 0 | −1 | −1 | −2 |
| 65 | 0 | −1 | −1 | 2 |
| 66 | 0 | −1 | 1 | −2 |
| 67 | 0 | −1 | 1 | 2 |
| 68 | 0 | −1 | 2 | −1 |
| 69 | 0 | −1 | 2 | 1 |
| 70 | 0 | 1 | −2 | −1 |
| 71 | 0 | 1 | −2 | 1 |
| 72 | 0 | 1 | −1 | −2 |
| 73 | 0 | 1 | −1 | 2 |
| 74 | 0 | 1 | 1 | −2 |
| 75 | 0 | 1 | 1 | 2 |
| 76 | 0 | 1 | 2 | −1 |
| 77 | 0 | 1 | 2 | 1 |
| 78 | 0 | 2 | −1 | −1 |
| 79 | 0 | 2 | −1 | 1 |
| 80 | 0 | 2 | 1 | −1 |
| 81 | 0 | 2 | 1 | 1 |
| 82 | 0 | −2 | −2 | 0 |
| 83 | 0 | −2 | 0 | −2 |
| 84 | 0 | −2 | 0 | 2 |
| 85 | 0 | −2 | 2 | 0 |
| 86 | 0 | 0 | −2 | −2 |
| 87 | 0 | 0 | −2 | 2 |
| 88 | 0 | 0 | 2 | −2 |
| 89 | 0 | 0 | 2 | 2 |
| 90 | 0 | 2 | −2 | 0 |
| 91 | 0 | 2 | 0 | −2 |
| 92 | 0 | 2 | 0 | 2 |
| 93 | 0 | 2 | 2 | 0 |
| 94 | 0 | −2 | −2 | −1 |
| 95 | 0 | −2 | −2 | 1 |
| 96 | 0 | −2 | −1 | −2 |
| 97 | 0 | −2 | −1 | 2 |
| 98 | 0 | −2 | 1 | −2 |
| 99 | 0 | −2 | 1 | 2 |
| 100 | 0 | −2 | 2 | −1 |
| 101 | 0 | −2 | 2 | 1 |
| 102 | 0 | −1 | −2 | −2 |
| 103 | 0 | −1 | −2 | 2 |
| 104 | 0 | −1 | 2 | −2 |
| 105 | 0 | −1 | 2 | 2 |
| 106 | 0 | 1 | −2 | −2 |
| 107 | 0 | 1 | −2 | 2 |
| 108 | 0 | 1 | 2 | −2 |
| 109 | 0 | 1 | 2 | 2 |
| 110 | 0 | 2 | −2 | −1 |
| 111 | 0 | 2 | −2 | 1 |
| 112 | 0 | 2 | −1 | −2 |
| 113 | 0 | 2 | −1 | 2 |
| 114 | 0 | 2 | 1 | −2 |
| 115 | 0 | 2 | 1 | 2 |
| 116 | 0 | 2 | 2 | −1 |
| 117 | 0 | 2 | 2 | 1 |
| 118 | 0 | −2 | −2 | −2 |
| 119 | 0 | −2 | −2 | 2 |
| 120 | 0 | −2 | 2 | −2 |
| 121 | 0 | −2 | 2 | 2 |
| 122 | 0 | 2 | −2 | −2 |
| 123 | 0 | 2 | −2 | 2 |
| 124 | 0 | 2 | 2 | −2 |
| 125 | 0 | 2 | 2 | 2 |

Receiver Control Decoder

Figure 19:
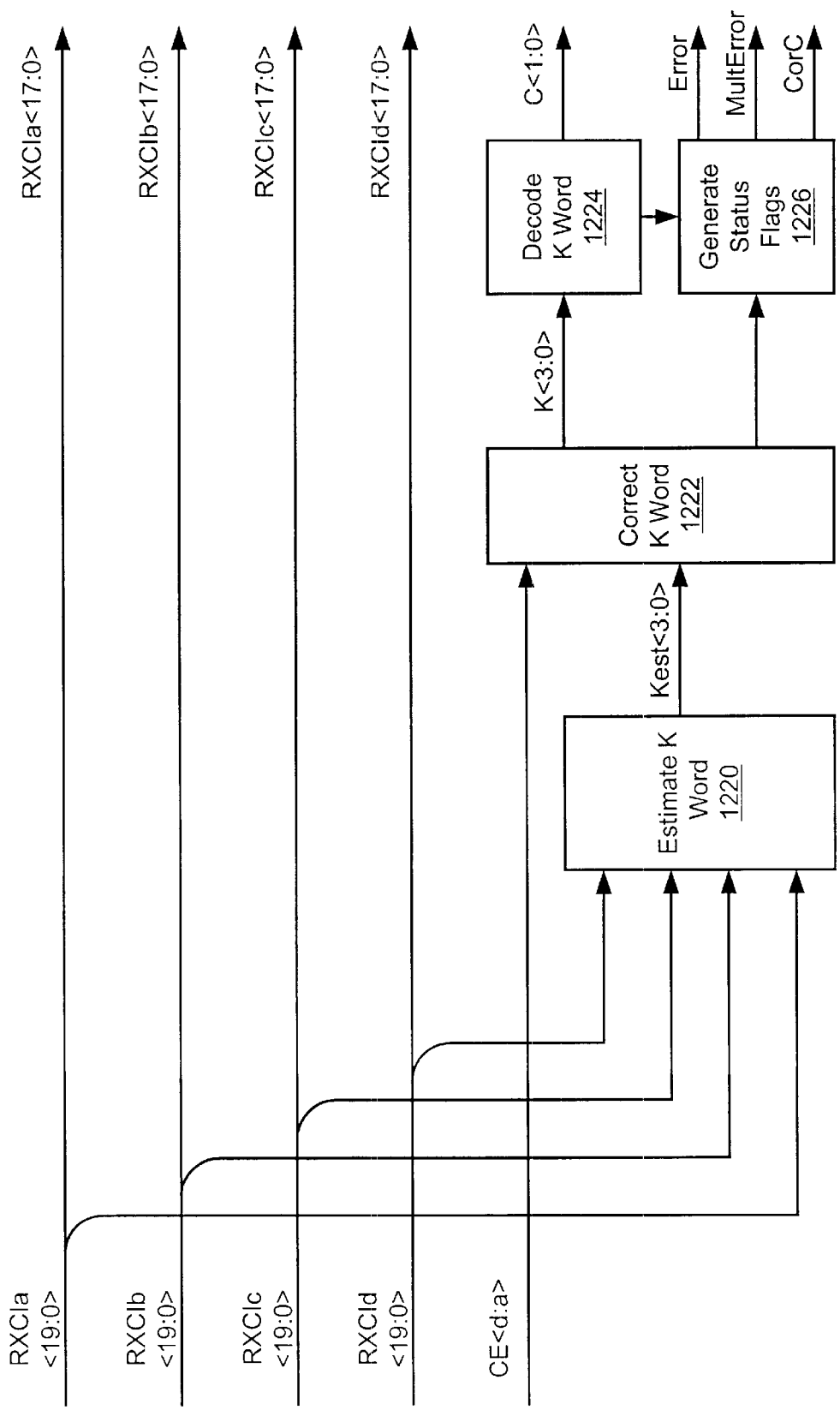
FIG. 19 is a block diagram illustrating control error correction code (ECC) logic depicted in FIG. 17.
Figure 20A:
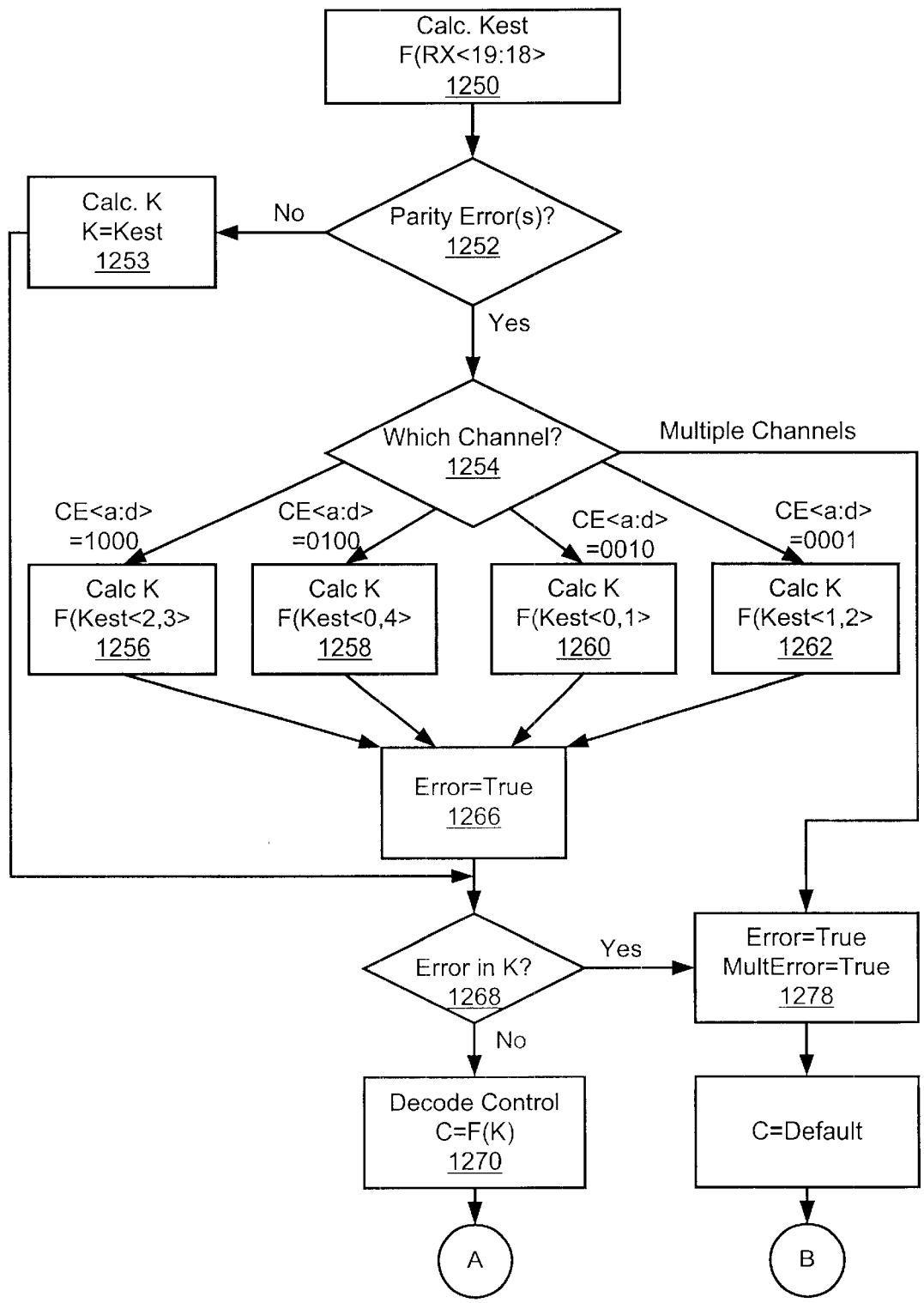
FIGS. 20a and 20b are a flow diagram illustrating control correction code decoder operation.
Figure 20B:
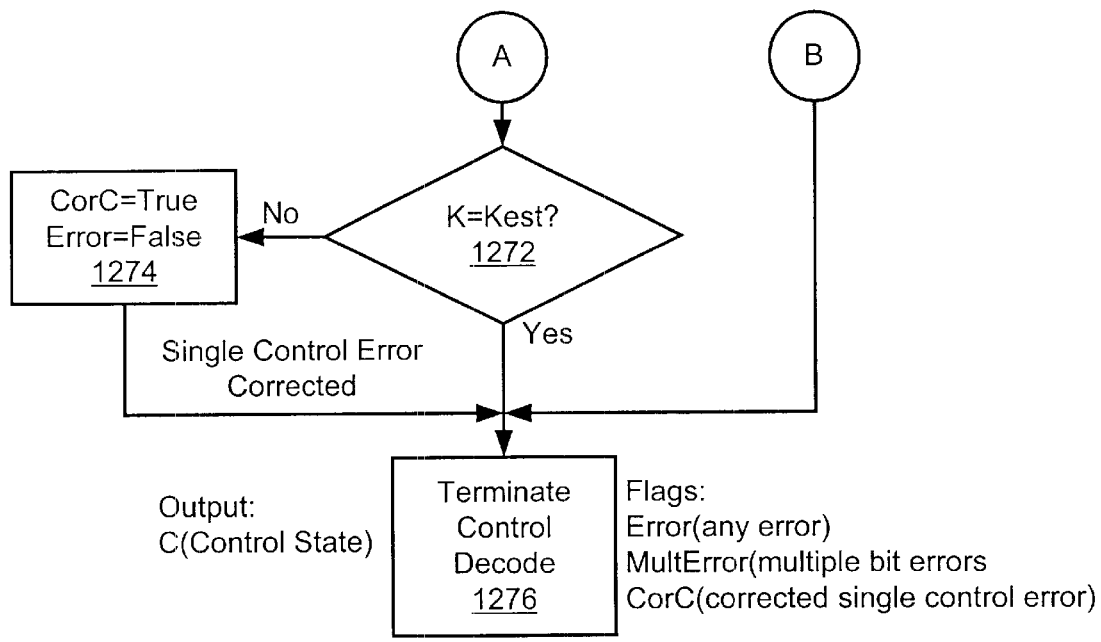

Control decoding can proceed once correct word and inter-channel alignment of the serially received data is achieved. The control portion of the cell is not scrambled and can be decoded without scrambler synchronization. The redundant nature of the control coding allows for correction of any single bit error or detection of double bit errors in the control bits of the cell (R0 and R1 in RXCI<18> and RXCI<19> respectively). A block diagram depicting exemplary Control ECC Decoder Logic 1160 is shown in FIG. 19. The method used to decode the control word is shown in FIGS. 20*a* and 20*b*. The R0 and R1 bits (RXCI<19:18>) are decoded in K word estimation logic 1220 to give an estimate of K in accordance with the equations set forth below.

$$\hat{K}_0 = !(R0_a + R0_d + R1_d) = !(RX<18>_a + RX<18>_d + RX<19>_d)$$

$$\hat{K}_1 = !(R0_b + R0_a + R1_a) = !(RX<18>_b + RX<18>_a + RX<19>_a)$$

$$\hat{K}_2 = !(R0_c + R0_b + R1_b) = !(RX<18>_c + RX<18>_b + RX<19>_b)$$

$$\hat{K}_3 = !(R0_d + R0_c + R1_c) = !(RX<18>_d + RX<18>_c + RX<19>_c)$$

The estimated value of K is then checked and corrected, if required, in K word correction logic 1222. Correction is possible because the control information in K can be recovered from only two channels and the channel parity checks indicate which channel is in error. The dependence of the K value on the channel is clear from the equations above.

$$\hat{K}_0 = F(A,D)$$

$$\hat{K}_1 = F(A,B)$$

$$\hat{K}_2 = F(B,C)$$

$$\hat{K}_3 = F(C,D)$$

Where F(x) indicates the output is a function of x. The coding of K is such that the correct value of K can be regenerated with the loss of any one channel. The Control State, C<1:0>, is decoded from the corrected K value in K word decode logic 1224 and status flags are generated in status flag generation logic 1226. In particular, the status flag generator asserts an error signal in the event a single bit error is detected, asserts a MultError signal in the event a multi-bit error is detected and asserts a CorC signal in the event a single bit error in the control field C<1:0> is detected and corrected.

The flow diagram of FIGS. 20a and 20b illustrates the operation of the control ECC decoder depicted in FIG. 19 and discussed above. Estimated values of K bits are calculated as described above and as illustrated in step 1250. Inquiry is made whether any parity errors were detected in the respective channels as shown in inquiry steps 1252 and 1254.

If a single parity error is detected in channel A as indicated by a CE<a:d> value of 1000, the correct value of K is calculated based on the R0 values contained in channels 2 and 3 as indicated in step 1256. If a single parity error is detected in channel B as indicated by a CE<a:d> value of 0100, as indicated in step 1258, the correct value of K is calculated based on the R0 values contained in channels 0 and 4. If a single parity error is detected in channel C as indicated by a CE<a:d> value of 0010, as indicated in step 1260, the correct value of K is calculated based on the R0 values contained in channels 0 and 1. If a single parity error is detected in channel D as indicated by a CE<a:d> value of 0001, as indicated in step 1262, the correct value of K is calculated based on the R0 values contained in channels 1 and 2. A variable Error is then set to equal true, as depicted in step 1266 to indicate that a single channel error has been detected. If as a result of inquiry step 1254 it is determined that CE<a:d> indicates errors in two or more channels, control passes to step 1278.

A determination is next made whether there is an error in K in inquiry step 1268. If there is no error in K, the control bits C<1:0> are decoded as a function of K as illustrated in step 1270. Inquiry is then made whether the value of K equals the value of K estimated as depicted in step 1272. If K=K estimated, no control error was detected and control decoding is terminated as illustrated in step 1276. If K does not equal K estimated, control passes to step 1274. In step 1274 an indication is recorded that a single bit control error has been detected and corrected. Following step 1274, control decoding is terminated as indicated in step 1276.

If it is determined in step 1268 that there is an error in K, control passes to step 1278 and an indication of an error and the fact that the error involves a multi-channel error is recorded. The C values are then set to a default condition as illustrated in step 1280 since the multiple errors cannot be corrected. Following step 1280 control passes to step 1276 and control decoding is terminated.

Receiver De-Scrambler

The De-scrambler 1158 (FIG. 17) corresponds to the de-scrambler discussed hereinabove with respect to FIG. 8. Each channel has a separate de-scrambler 1158a, 1158b, 1158c and 1158d (FIG. 17) and employs the logic depicted in FIG. 8 in a preferred embodiment. The receive logic can detect when an Idle cell is being transmitted with the decoded Control State data appearing on control lines C<1:0>. This will occur frequently during the Inter Packet Gap (IPG) of a normal Ethernet transmission. Presence of Idle cells can be guaranteed by use of the known Far End Fault protocol provided in the Ethernet standard. The Idle state is defined to have 0x0000 in the 16 least significant bits of the data payload in each channel. The Idle is scrambled in each channel but if the data field is zeros then RXCI<14:0> is the scrambler state (seed) in each channel.

The scrambler seed is recovered and loaded into the receiver scramblers. The sequence can be completely recovered in one idle period because the sequence length is 15 and the complete state is defined in each channel's data payload. The Monitor bit and its effect on the error correction terms do not effect the bits used for scrambler seed acquisition and are not restricted during idle transmission. Scrambler state can be recovered in each channel separately or the receiver can use the property that all channels have synchronized scrambler states which are offset from each other by a known amount.

A state machine controls the scrambler state acquisition and verifies that the scrambler remains in lock during Idle cells. Scrambler states between channels can also be optionally checked. The data ECC decoder 1162 (FIG. 17), that follows the de-scrambler 1158, also provides an indication of loss of de-scrambler sync by recording a high number of multiple errors.

The outputs of the respective de-scramblers 1158a, 1158b, 1158c and 1158d provide plain data that is identified as TXPa<17:0>, TXPb<17:0>, RXPc<17:0> and RXPd<17:0> as indicated above. The de-scrambler output buses are coupled to the inputs of the Receive Interleaver and Data ECC Decoder 1162 (FIG. 17).

Receive Interleave and Data ECC Decoder

Figure 21:
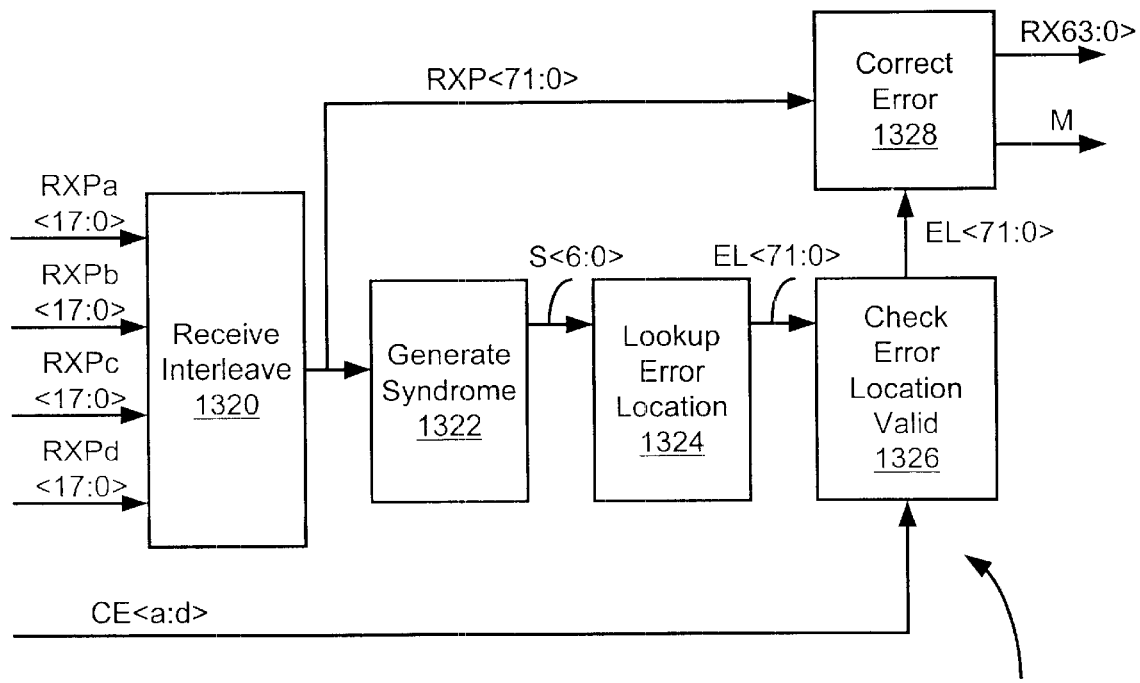
FIG. 21 is a block diagram illustrating the data error correction code decoder logic employed within the receive portion of the physical coding sublayer logic.

The Receive Interleave and Data ECC Decoder 1162 (See FIG. 17) recovers the data from each of the channels and performs the Data ECC Decoder functions. An exemplary block diagram of a Receive Interleave and Data ECC Decoder is depicted in FIG. 21. The receive interleave logic 1320 (FIG. 21) is performed in accordance with the following equations to reproduce the original data ordering to the transmit interleaver 1053 (FIG. 14). The interleave function may simply constitute the recombination of the RXP<17:0> plain data to form the original data word, the ECC bits E<6:0> and the monitor bit M.

RXP<71:0>=<RXPd17, RXPd16, RXPc17, RXPc16, RXPb17, RXPb16, RXPa17, RXPa16, RXPd15. RXPd0, RXPc15 . . . RXPc0, RXPb15.RXPb0, RXPa15. RXPa0>

Receive Data ECC Decoder

The Receive Data ECC Decoder 1162 (FIG. 17) is illustrated in greater detail in FIG. 21. The receive data ECC decoder 1162 uses the redundant E<6:0> bits in the physical coding sublayer cell payload contained within the respective RXP channels RXPa, RXPb, RXPC and RXPd to detect and correct errors in the data payload. The data from each channel is combined using the receive interleave logic 1320 (FIG. 21). The syndrome S<6:0> is calculated in the syndrome generator 1322 over the 72-bit payload using the syndrome generation equations set forth below.

$S0 = RXP2 + RXP5 + RXP9 + RXP10 +$ $RXP11 + RXP16 + RXP18 + RXP19 + RXP20 +$ $RXP21 + RXP22 + RXP25 + RXP27 + RXP29 +$ $RXP30 + RXP31 + RXP34 + RXP35 + RXP37 +$ $RXP41 + RXP44 + RXP45 + RXP46 + RXP47 +$ $RXP51 + RXP53 + RXP58 + RXP59 + RXP65;$ $S1 = RXP0 + RXP3 + RXP6 + RXP10 +$ $RXP11 + RXP12 + RXP17 + RXP19 + RXP20 +$

RXP21+*RXP22*+*RXP23*+*RXP26*+*RXP28*+

RXP30+*RXP31*+*RXP32*+*RXP35*+*RXP36*+

RXP38+*RXP42*+*RXP45*+*RXP46*+*RXP47*+

RXP48+*RXP52*+*RXP54*+*RXP59*+*RXP60*+*RXP66*;

S2=*RXP0*+*RXP1*+*RXP4*+*RXP7*+

RXP11+*RXP12*+*RXP13*+*RXP18*+*RXP20*+

RXP21+*RXP22*+*RXP23*+*RXP24*+*RXP27*+

RXP29+*RXP31*+*RXP32*+*RXP33*+*RXP36*+

RXP37+*RXP39*+*RXP43*+*RXP46*+*RXP47*+

RXP48+*RXP49*+*RXP53*+*RXP55*+*RXP60*+

RXP61+*RXP67*;

S3=*RXP1*+*RXP2*+*RXP5*+*RXP8*+

RXP12+*RXP13*+*RXP14*+*RXP19*+*RXP21*+

RXP22+*RXP23*+*RXP24*+*RXP25*+*RXP28*+

RXP30+*RXP32*+*RXP33*+*RXP34*+*RXP37*+

RXP38+*RXP40*+*RXP44*+*RXP47*+*RXP48*+

RXP49+*RXP50*+*RXP54*+*RXP56*+*RXP61*+

RXP62+*RXP68*;

S4=*RXP0*+*RXP2*+*RXP3*+*RXP6*+

RXP9+*RXP13*+*RXP14*+*RXP15* +*RXP20*+

RXP22+*RXP23*+*RXP24*+*RXP25*+*RXP26*+

RXP29+*RXP31*+*RXP33*+*RXP34*+*RXP35*+

RXP38+*RXP39*+*RXP41*+*RXP45*+*RXP48*+

RXP49+*RXP50*+*RXP51*+*RXP55*+*RXP57*+

RXP62+*RXP63*+*RXP69*;

S5=*RXP0*+*RXP1*+*RXP3*+*RXP4*+

RXP7+*RXP10*+*RXP14*+*RXP15*+*RXP16*+

RXP21+*RXP23*+*RXP24*+*RXP25*+*RXP26*+

RXP27+*RXP30*+*RXP32*+*RXP34*+*RXP35*+

RXP36+*RXP39*+*RXP40*+*RXP42*+*RXP46*+

RXP49+*RXP50*+*RXP51*+*RXP52*+*RXP56*+

RXP58+*RXP63*+*RXP64*+*RXP70*;

S6=*RXP1*+*RXP4*+*RXP8*+*RXP9*+

RXP10+*RXP15*+*RXP17*+*RXP18*+*RXP19*+

RXP20+*RXP21*+*RXP24*+*RXP26*+*RXP28*+

RXP29+*RXP30*+*RXP33*+*RXP34*+*RXP36*+

RXP40+*RXP43*+*RXP44*+*RXP45*+*RXP46*+

RXP50+*RXP52*+*RXP57*+*RXP58*+*RXP64*+*RXP71*;

Any value for the generated syndrome other than zero indicates the presence of an error. All single bit errors will yield a unique syndrome value, which indicates the location of the error within the 72-bit field. The error location is determined in Lookup logic 1324 using the illustrative lookup table shown in Table 9 below. The error is then cross-checked against the channel parity flags using error check logic 1326 and corrected, if possible using error correction logic 1328. The 64-bit data message and monitor bits are then extracted and coupled to the XGMII receive controller 1164 (FIG. 17).

TABLE 9

Syndrome to Error Location

| Syndrome Value | | | Error Location | | |
|---|---|---|---|---|---|
| S<6:0> | S (hex) | S (dec) | (hex) | (dec) | Channel |
| 0000000 | 00 | 0 | No Error | No Error | 0000 |
| 0000001 | 01 | 1 | 41 | 65 | 1000 |
| 0000010 | 02 | 2 | 42 | 66 | 0100 |
| 0000011 | 03 | 3 | 3B | 59 | 0001 |
| 0000100 | 04 | 4 | 43 | 67 | 0100 |
| 0000101 | 05 | 5 | 35 | 53 | 0001 |
| 0000110 | 06 | 6 | 3C | 60 | 0001 |
| 0000111 | 07 | 7 | 0B | 11 | 1000 |
| 0001000 | 08 | 8 | 44 | 68 | 0010 |
| 0001001 | 09 | 9 | 05 | 5 | 1000 |
| 0001010 | 0A | 10 | 36 | 54 | 0001 |
| 0001011 | 0B | 11 | N/A | Mult Error | 1111 |
| 0001100 | 0C | 12 | 3D | 61 | 0001 |
| 0001101 | 0D | 13 | 25 | 37 | 0010 |
| 0001110 | 0E | 14 | 0C | 12 | 1000 |
| 0001111 | 0F | 15 | 2F | 47 | 0010 |
| 0010000 | 10 | 16 | 45 | 69 | 0010 |
| 0010001 | 11 | 17 | 29 | 41 | 0010 |
| 0010010 | 12 | 18 | 06 | 6 | 1000 |
| 0010011 | 13 | 19 | N/A | Mult Error | 1111 |
| 0010100 | 14 | 20 | 37 | 55 | 0001 |
| 0010101 | 15 | 21 | N/A | Mult Error | 1111 |
| 0010110 | 16 | 22 | N/A | Mult Error | 11*11 |
| 0011001 | 19 | 25 | 02 | 2 | 1000 |
| 0011010 | 1A | 26 | 26 | 38 | 0010 |
| 0011011 | 1B | 27 | N/A | Mult Error | 1111 |
| 0011100 | 1C | 28 | 0D | 13 | 1000 |
| 0011101 | 1D | 29 | N/A | Mult Error | 1111 |
| 0011110 | 1E | 30 | 30 | 48 | 0001 |
| 0011111 | 1F | 31 | 16 | 22 | 0100 |
| 0100000 | 20 | 32 | 46 | 70 | 0001 |
| 0100001 | 21 | 33 | 10 | 16 | 0100 |
| 0100010 | 22 | 34 | 2A | 42 | 0010 |
| 0100011 | 23 | 35 | N/A | Mult Error | 1111 |
| 0100100 | 24 | 36 | 07 | 7 | 1000 |
| 0100101 | 25 | 37 | 1B | 27 | 0100 |
| 0100110 | 26 | 38 | N/A | Mult Error | 1111 |
| 0100111 | 27 | 39 | N/A | Mult Error | 1111 |
| 0101000 | 28 | 40 | 38 | 56 | 0001 |
| 0101001 | 29 | 41 | N/A | Mult Error | 1111 |
| 0101010 | 2A | 42 | N/A | Mult Error | 1111 |
| 0101011 | 2B | 43 | N/A | Mult Error | 1111 |
| 0101100 | 2C | 44 | N/A | Mult Error | 1111 |
| 0101101 | 2D | 45 | N/A | Mult Error | 1111 |
| 0101110 | 2E | 46 | 20 | 32 | 0010 |
| 0101111 | 2F | 47 | N/A | Mult Error | 1111 |
| 0110000 | 30 | 48 | 3F | 63 | 0001 |
| 0110001 | 31 | 49 | 33 | 51 | 0001 |

TABLE 9-continued

Syndrome to Error Location

| Syndrome Value | | | Error Location | | |
|---|---|---|---|---|---|
| S<6:0> | S (hex) | S (dec) | (hex) | (dec) | Channel |
| 0110010 | 32 | 50 | 03 | 3 | 1000 |
| 0110011 | 33 | 51 | 23 | 35 | 0010 |
| 0110100 | 34 | 52 | 27 | 39 | 0010 |
| 0110101 | 35 | 53 | N/A | Mult Error | 1111 |
| 0110110 | 36 | 54 | 00 | 0 | 1000 |
| 0110111 | 37 | 55 | N/A | Mult Error | 1111 |
| 0111000 | 38 | 56 | 0E | 14 | 1000 |
| 0111001 | 39 | 57 | 19 | 25 | 0100 |
| 0111010 | 3A | 58 | N/A | Mult Error | 1111 |
| 0111011 | 3B | 59 | N/A | Mult Error | 1111 |
| 0111100 | 3C | 60 | 31 | 49 | 0001 |
| 0111101 | 3D | 61 | N/A | Mult Error | 1111 |
| 0111110 | 3E | 62 | 17 | 23 | 0100 |
| 0111111 | 3F | 63 | N/A | Mult Error | 1111 |
| 1000000 | 40 | 64 | 47 | 71 | 0001 |
| 1000001 | 41 | 65 | N/A | Mult Error | 1111 |
| 1000010 | 42 | 66 | 11 | 17 | 0100 |
| 1000011 | 43 | 67 | N/A | Mult Error | 1111 |
| 1000100 | 44 | 68 | 2B | 43 | 0010 |
| 1000101 | 45 | 69 | 12 | 18 | 0100 |
| 1000110 | 46 | 70 | N/A | Mult Error | 1111 |
| 1000111 | 47 | 71 | N/A | Mult Error | 1111 |
| 1001100 | 4C | 76 | N/A | Mult Error | 1111 |
| 1001101 | 4D | 77 | N/A | Mult Error | 1111 |
| 1001110 | 4E | 78 | N/A | Mult Error | 1111 |
| 1001111 | 4F | 79 | N/A | Mult Error | 1111 |
| 1010000 | 50 | 80 | 39 | 57 | 0001 |
| 1010001 | 51 | 81 | 09 | 9 | 1000 |
| 1010010 | 52 | 82 | N/A | Mult Error | 1111 |
| 1010011 | 53 | 83 | 2D | 45 | 0010 |
| 1010100 | 54 | 84 | N/A | Mult Error | 1111 |
| 1010101 | 55 | 85 | 1D | 29 | 0100 |
| 1010110 | 56 | 86 | N/A | Mult Error | 1111 |
| 1010111 | 57 | 87 | 14 | 20 | 0100 |
| 1011000 | 58 | 88 | N/A | Mult Error | 1111 |
| 1011001 | 59 | 89 | N/A | Mult Error | 1111 |
| 1011010 | 5A | 90 | N/A | Mult Error | 1111 |
| 1011011 | 5B | 91 | N/A | Mult Error | 1111 |
| 1011100 | 5C | 92 | 21 | 33 | 0010 |
| 1011101 | 5D | 93 | N/A | Mult Error | 1111 |
| 1011110 | 5E | 94 | N/A | Mult Error | 1111 |
| 1011111 | 5F | 95 | N/A | Mult Error | 1111 |
| 1100000 | 60 | 96 | 40 | 64 | 1000 |
| 1100001 | 61 | 97 | 3A | 58 | 0001 |
| 1100010 | 62 | 98 | 34 | 52 | 0001 |
| 1100011 | 63 | 99 | 0A | 10 | 1000 |
| 1100100 | 64 | 100 | 04 | 4 | 1000 |
| 1100101 | 65 | 101 | N/A | Mult Error | 1111 |
| 1100110 | 66 | 102 | 24 | 36 | 0010 |
| 1100111 | 67 | 103 | 2E | 46 | 0010 |
| 1101000 | 68 | 104 | 28 | 40 | 0010 |
| 1101001 | 69 | 105 | N/A | Mult Error | 1111 |
| 1101010 | 6A | 106 | N/A | Mult Error | 1111 |
| 1101011 | 6B | 107 | 1E | 30 | 0100 |
| 1101100 | 6C | 108 | 01 | 1 | 1000 |
| 1101101 | 6D | 109 | N/A | Mult Error | 1111 |
| 1101110 | 6E | 110 | N/A | Mult Error | 1111 |
| 1101111 | 6F | 111 | 15 | 21 | 0100 |
| 1110000 | 70 | 112 | 0F | 15 | 1000 |
| 1110001 | 71 | 113 | N/A | Mult Error | 1111 |
| 1110010 | 72 | 114 | 1A | 26 | 0100 |
| 1110011 | 73 | 115 | N/A | Mult Error | 1111 |
| 1110100 | 74 | 116 | N/A | Mult Error | 1111 |
| 1110101 | 75 | 117 | N/A | Mult Error | 1111 |
| 1110110 | 76 | 118 | N/A | Mult Error | 1111 |
| 1110111 | 77 | 119 | N/A | Mult Error | 1111 |
| 1111000 | 78 | 120 | 32 | 50 | 0001 |
| 1111001 | 79 | 121 | 22 | 34 | 0010 |
| 1111010 | 7A | 122 | N/A | Mult Error | 1111 |
| 1111011 | 7B | 123 | N/A | Mult Error | 1111 |
| 1111100 | 7C | 124 | 18 | 24 | 0100 |
| 1111101 | 7D | 125 | N/A | Mult Error | 1111 |
| 1111110 | 7E | 126 | N/A | Mult Error | 1111 |
| 1111111 | 7F | 127 | N/A | Mult Error | 1111 |

Multiple errors are checked using several methods that guarantee detection of all two-bit errors. The R1 channel parity bits are used to cross check the location of a single bit error. Absence of a parity error with a non-zero syndrome indicates a multiple bit error. A syndrome that does not map to a valid error location indicates a multiple bit error.

Figure 22A:
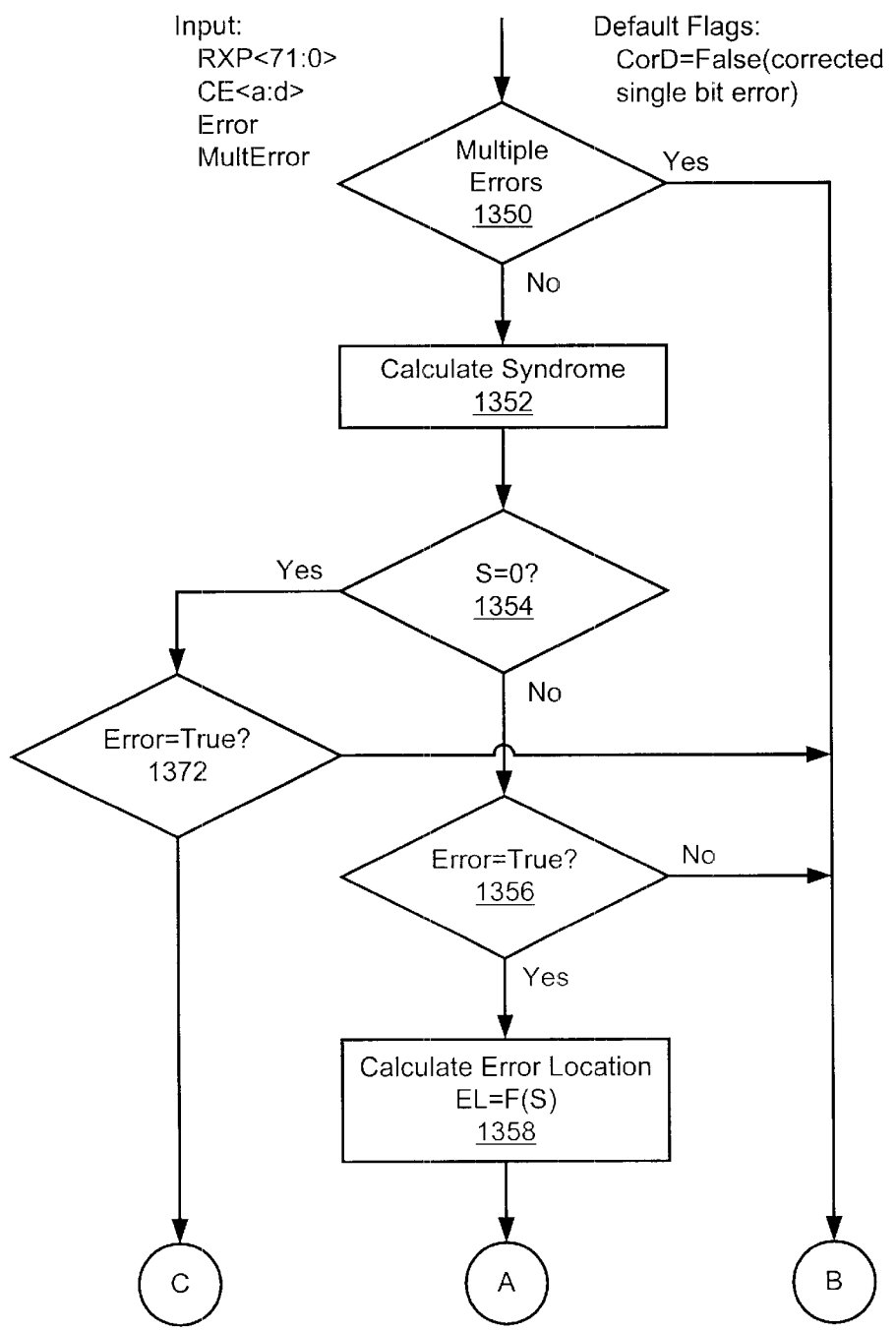
Figure 22B:
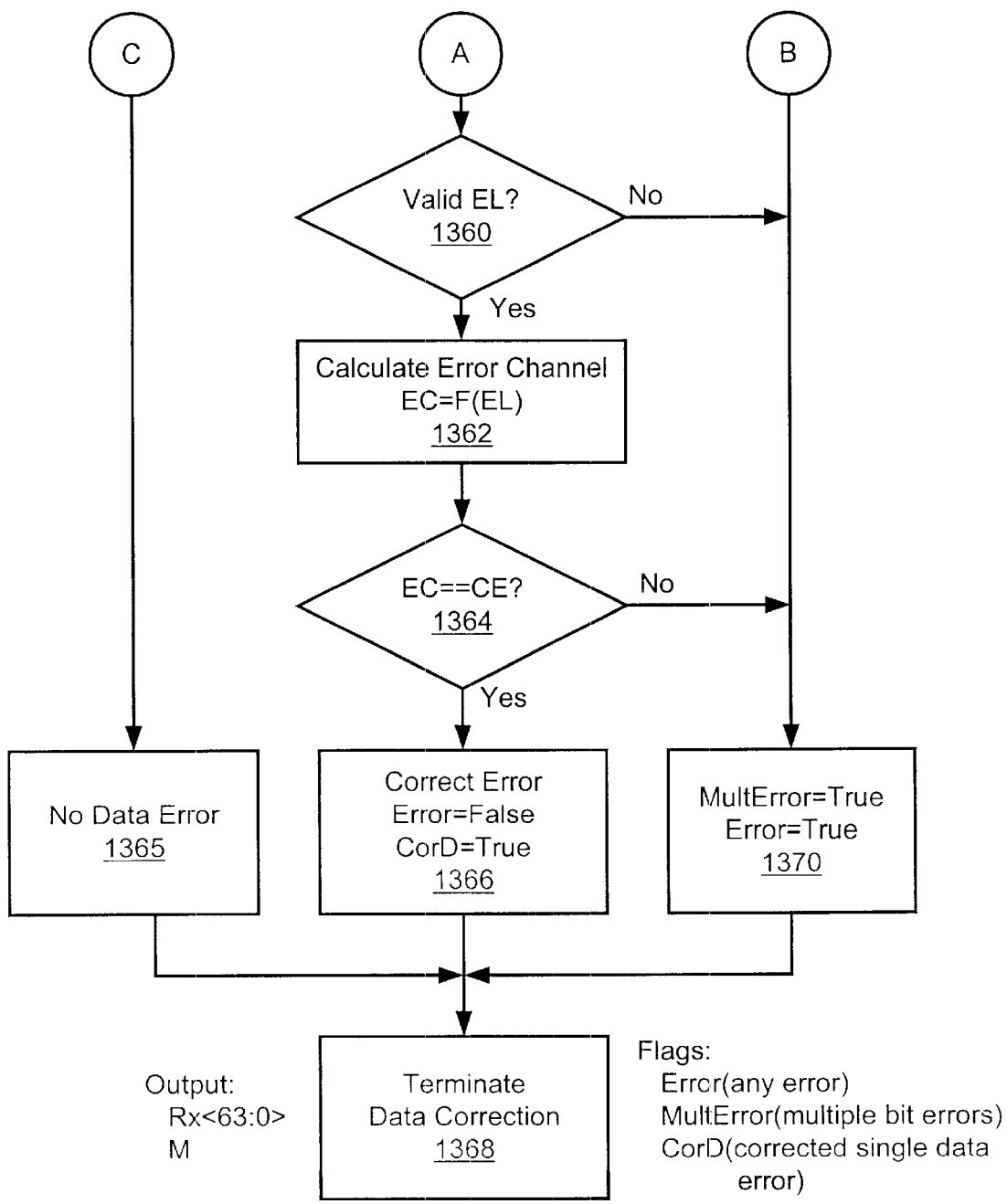

The method of operation of the data error correction code decoder is further illustrated in the flow chart depicted in FIGS. 22*a* and 22*b*. The Data ECC Decoder 1162 (FIG. 17) first checks if multiple errors have been detected by the Control ECC Decoder 1160 (FIG. 17) as shown in the Multiple Errors inquiry step 1350 (FIG. 22*a*). This is determined by examining the MultError input flag. If multiple errors are detected in inquiry step 1350 the Data ECC Decoder 1162 (FIG. 17) does not attempt decoding and terminates through step 1370 setting the MultError and Error status flags and through step 1368. If no multiple errors were detected by inquiry step 1350 the Data ECC Decoder 1162 calculates the syndrome as shown in step 1352. The syndrome value is checked as depicted in inquiry step 1354. If the syndrome value is zero, the Data ECC Decoder 1162 checks if the Error flag is set as shown in inquiry step 1372. The Error flag indicates an error was detected in any channel by checking the parity. If an error was detected in inquiry step 1372 the Data ECC Decoder 1162 terminates through step 1370 setting the MultError and Error status flags and through step 1368 because it is not possible to get a zero syndrome value and a channel error without having multiple errors. If the Error flag is not set in inquiry step 1372, then the Data ECC Decoder 1162 terminates through the No Data Error step 1372 and through step 1368 because no error was detected and no correction is required. If the syndrome value checked in inquiry step 1354 is non-zero then an error was detected. The Data ECC Decoder 1162 then checks the Error flag in inquiry step 1356 to determine if a parity error has been found in any channel. If it is determined in inquiry step 1356 that the Error flag is not set, the Data ECC Decoder 1162 terminates through step 1370 setting the MultError and Error status flags and through step 1368 because it is not possible obtain a non-zero syndrome value and no channel error without having multiple errors. If the Error flag detected an error in inquiry step 1356 then the Data ECC Decoder 1162 proceeds to calculate the error location in step 1358 because the syndrome and Error flags are both consistent in detecting an error. As shown in the Calculate Error Location step 1358, the Data ECC decoder 1162 calculates the error location from the syndrome value which is then checked as depicted in the Valid Error Location inquiry step 1360 (FIG. 22*b*). If it is determined in inquiry step 1360 that the error location is not valid, i.e., does not correspond to any of the 72 received bits in RXP<71:0>, the Data ECC Decoder 1162 terminates though step 1370 setting the MultError and Error status flags and through step 1368 because it is not possible to have a bad error location without having multiple errors. If the error location is validated by inquiry step 1360, the Data ECC Decoder 1162 calculates which channel the error occurred in as depicted in the Calculate Error Channel step 1362. The error channel is calculated from the error location and the known mapping of error location to transmitted channel. After the error channel (EC) is determined as depicted in step 1362, the error channel is checked against the channel error (CE) determined by the parity checks in each channel as depicted in inquiry step 1364. If the two error channel indicators do not match, as determined per inquiry step 1364, the Data ECC Decoder 1162 terminates through step 1370 setting the MultError and Error status flags and through step 1368 because it is not possible to get inconsistent channel errors without having multiple errors. If the channel error indicators match, as depicted in inquiry step 1364, the Data ECC Decoder 1162 corrects the single bit error in step 1366. The bit value at the calculated error location is flipped. The Data ECC Decoder 1162 then sets the error flag to false indicating an error is no longer present and sets the corrected data (CorD) flag indicating a single bit error has been corrected in the data field. The Data ECC Decoder 1162 then terminates through step 1368.

XGMII Receive Controller

The XGMII receive control logic 1164 (See FIG. 17) translates the receive state and data into XGMII format for delivery to the MAC 1011 within the system interface 1010 (FIG. 12). Mapping into the XGMII format is straightforward. Any uncorrected physical coding sublayer cell error received during a packet will generate corresponding symbol error(s) on the equivalent bytes on the XGMII. Cell errors received during idle will typically be discarded. In the event the XGMII interface requires cell errors to be identified to the MAC as a false carrier event, they should be so indicated.

Receiver Monitors and Statistics

The Receive State Sync Controller 1166 (FIG. 17) assures that synchronization of the received signal is obtained in the correct sequence and monitor the errors within the channel to declare the link down when the error rate reaches an unsustainable level. Synchronization is first achieved within each channel (Word Lock), then inter-channel alignment (Cell Lock), and then scrambler synchronization (Sync Lock). Any loss of synchronization by the lower process will automatically cause loss of the higher level synchronization states. The status of each of the receive blocks is indicated by flags and are collectively shown as RxFlags (FIG. 17). Word Lock indicates if word synchronization has been achieved in each channel. Cell Lock indicates that the complete physical coding sublayer cell is correctly aligned across all channels. Sync Lock in each channel indicates that the scramblers have acquired their correct states.

After acquisition, receive logic goes into a track mode where errors are detected and counted. Parity errors within each channel are indicated by the channel error variable, CE<a:d> (FIG. 1). The corrected control flag, CorC, indicates single control errors. Single data field errors are indicated by the corrected data flag, CorD. Multiple bit errors are indicated by the MultError flag, which can be generated either by the Control FEC Decoder or the Data FEC Decoder. MultError generates symbol error(s) on the receiver XGMII if they occur in a data frame.

The two single bit error flags (corrected control, CorC and corrected data, CorD) should be summed. A channel error mask (CE<a:d>) is used to keep separate counters on single bit errors per channel.

Multiple bit errors (100% of two-bit errors, lower probability of detection with higher bit errors) are accumulated in a separate counter. The error location of multiple bit errors is not guaranteed using physical coding sublayer encoding so only a single counter is employed in a preferred embodiment.

Inter-Channel Skew Circuit

An inter-channel skew circuit may optionally be inserted between the physical coding sublayer 1014 and the SERDES logic 1016 in each of the channels within the transmit path. The inter-channel skew circuit offsets the bits in each channel in time so that a burst of noise across all channels will produce errors that fall in different cells and thus can be corrected. An offset of one bit time between channels has been demonstrated to provide good results for NEXT and FEXT terms.

Figure 23:
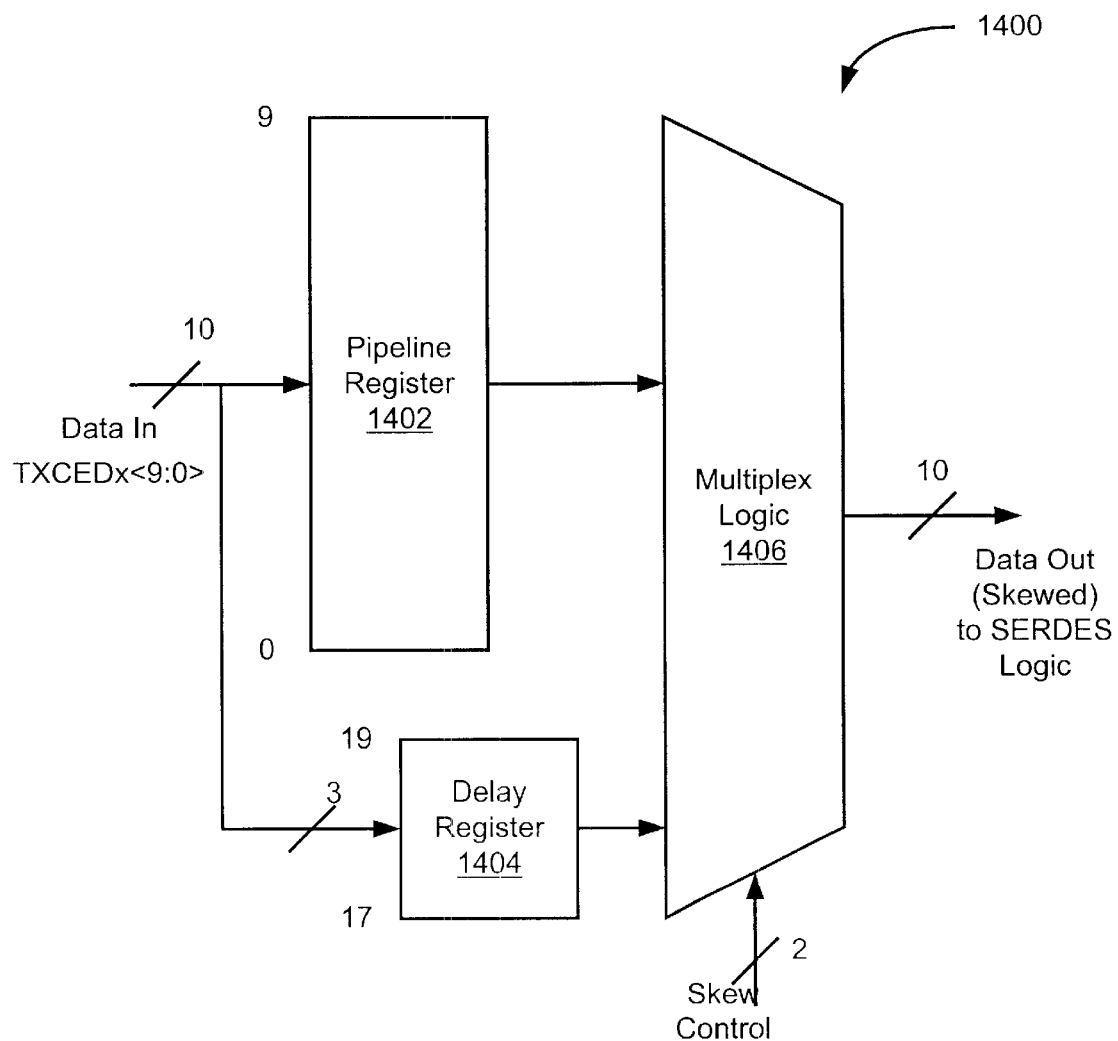
FIG. 23 is a block diagram of logic for introducing predetermined bit delays into respective serial channels.

An exemplary skew circuit 1400 is illustrated in FIG. 23. The illustrated skew circuit 1400 provides no skew, a single bit of skew, 2 bits of skew or three bits of skew to provide a single bit of skew between each of the four channels in the preferred embodiment discussed herein. Referring to FIG. 23 the skew circuit includes a pipeline register 1402 that receives 10 bit words from the physical coding sublayer logic 1014 (FIG. 13). The least significant bit is identified in FIG. 23 as bit 0 and the most significant bit is identified as bit 9. Bits 7, 8 and 9 of the received data word are coupled to a delay register. A three bit delay register is depicted to provide up to three bits of skew although it should be appreciated that the delay register 1404 may accommodate a larger number of bits should it be desired to provide more than three bits of skew. The outputs of the pipeline register 1402 and the delay register 1404 are coupled to inputs of multiplex logic 1406. The multiplex logic 1406 selects the bits to be output in response to the skew control inputs to such logic. More specifically, in response to a first skew control input, the multiplex logic provides as an output the 10 bits appearing at the input to the pipeline register 1402.

This first skew control input thus provides no skew. In response to a second skew control input, the multiplex logic 1406 outputs a 10 bit word that includes bit 9 from the delay register 1404 and bits 0 through 8 of the pipeline register 1402 thus introducing a single bit of skew. In response to a third skew control input, the multiplex logic 1406 outputs a 10 bit word that includes bits 8 and 9 from the delay register 1404 and bits 0 through 7 from the pipeline register 1402 thus introducing two bits of skew. Finally, in response to a fourth skew control input the multiplex logic 1406 outputs a 10 bit word that includes bits 7, 8 and 9 from the delay register 1404 and bits 0 through 6 from the pipeline register 1402 thus introducing three bits of skew.

In the preferred embodiment, no skew is provided in channel A, 1 bit of skew is introduced into channel B, 2 bits of skew are introduced into channel C and 3 bits of skew are introduced into channel D.

It will be apparent to those of ordinary skill in the art that modifications to and variations of the above described methods and apparatus for minimizing the susceptability to burst errors may be made without departing from the inventive concepts disclosed herein. Accordingly, the invention should not be viewed as limited except as by the scope and spirit of the appended claims.

What is claimed is:

1. A method for transmitting data over a serial data channel comprising the steps of:

receiving a plurality of n bit wide data units;

selectively interleaving the n bits of each one of said plurality of n bit wide data units with selected bits of other ones of said plurality of n bit wide data units to form a plurality of interleaved data words;

serializing said plurality of interleaved words to form a serial data stream, said interleaving within said plurality of interleaved data words being specified such that each one of said n bits of said plurality of n bit wide data units is spaced apart from adjacent bits of the respective n bit wide data units by at least m bits in said serial data stream;

transmitting said serial data stream over said serial data channel;

receiving said serial data stream;

converting said received serial data stream into a plurality of received interleaved data words; and de-interleaving said plurality of received interleaved data words to recover a received version of said plurality of n bit wide data units.

2. The method of claim 1 wherein each n bit wide data unit includes a data word and an error detection code and said method further includes the step following said de-interleaving step of utilizing said error detection code to detect whether an error is present in the received version of said n bit wide data unit; and in the event an error is detected in the received version of said n bit wide data unit, generating a signal indicative of said error.

3. The method of claim 2 wherein said n bit wide data unit further includes a framing signal and said converting step includes the step of utilizing said framing signal to obtain proper word framing for said plurality of received interleaved data words.

4. The method of claim 3 wherein said framing signal comprises a parity signal.

5. The method of claim 4 wherein said framing signal comprises a fixed data pattern.

6. The method of claim 5 wherein said fixed data pattern comprises a single bit.

7. The method of claim 5 wherein said fixed data pattern comprises a multi-bit data pattern.

8. The method of claim 2 wherein said data word and said error detection code comprise scrambled data and said converting step comprises the step of de-scrambling said scrambled data.

9. The method of claim 1 wherein m equals 4.

10. The method of claim 1 wherein m equals 10.

11. The method of claim 1 wherein each n bit wide data unit includes a data word and a error correction code and said method further includes the step following said de-interleaving step of utilizing said error correction code to detect whether an error is present in the received version of said n bit wide data units; and in the event an error is detected in the received version of one of said n bit wide data units, correcting the error in the respective received n bit wide data unit.

12. The method of claim 11 wherein each n bit wide data unit further includes a framing signal and said converting step includes the step of utilizing said framing signal to obtain proper word framing for said plurality of received interleaved data words.

13. The method of claim 12 wherein said framing signal comprises a parity signal.

14. The method of claim 12 wherein said framing signal comprises a fixed data pattern.

15. The method of claim 14 wherein said fixed data pattern comprises a single bit.

16. The method of claim 14 wherein said fixed data pattern comprises a multi-bit data pattern.

17. The method of claim 11 wherein said data word and said error correction code comprise scrambled data and said converting step comprises the step of de-scrambling said scrambled data.

18. The method of claim 11 wherein m equals 4.

19. The method of claim 11 wherein m equals 10.

20. Apparatus for transmitting data over a serial data channel comprising:

receive logic for receiving a plurality of n bit wide data units;

interleave logic for selectively interleaving the n bits of each one of said plurality of n bit wide data units with selected bits of other ones of said plurality of n bit wide data units to form a plurality of interleaved data words;

serialization logic operative to generate a serial data stream representative of said plurality of received plurality of n bit wide data units in which adjacent bits within said plurality of data units are spaced apart by at least p bits in said serial data stream;

transmit logic for transmitting said serial data stream over said serial data channel; and receive logic for receiving said serial data stream transmitted over said serial data channel;

de-interleave logic for de-interleaving said serial data stream to reproduce said plurality of data units.

21. The apparatus of claim 20 wherein said interleave logic includes m cascaded registers, said m cascaded registers including a receive register for receiving said plurality of data words and m−1 additional cascaded registers, said interleave logic further including an output register, said m cascaded registers and said output register having inputs and outputs, said inputs of said m−1 cascaded registers being coupled to at least selected outputs of a preceeding cascaded register such that said m−1 additional cascaded registers each produce at their respective outputs time delayed bits from the preceeding cascaded register, selected outputs of said cascaded registers being coupled to selected inputs of said output register, said apparatus further including a serializer for serializing data appearing at the outputs of said output register to produce said serial data stream; and selected outputs of said cascaded registers being coupled to selected inputs of said output register such that adjacent bits in said received data words are spaced apart by said m bits in said serial data stream.

22. The apparatus of claim 21 wherein said de-interleave logic includes a de-serializer for generating parallel data words from said serial data stream received over said serial channel, m+1 registers for storing m+1 sequentially received parallel data words and a multiplexer for selecting bits from said m+1 registers to reconstruct successive ones of said plurality of words received at said receive register.

23. A method for transmitting data over a plurality of serial data channels comprising the steps of:

receiving a plurality of data units, each of said data units having a predetermined width;

dividing each of said received data units into p lesser width data units for transmission over p serial data channels, where p is an integer greater than or equal to two;

generating p serial data streams from said p lesser width data units by interleaving the bits of each lesser width data unit with bits of other lesser width data units such that each bit of each one of said p lesser width data units is spaced apart by at least m bits in the respective serial data streams, where m is an integer greater than or equal to two;

transmitting said p serial data streams over said p serial data channels;

receiving said p serial data streams;

de-serializing the respective received serial data stream for each of said p serial data channels;

for each received serial data stream, de-interleaving the bits received over the respective serial data channel to regenerate a received version of the respective lesser width data unit; and combining said received versions of said p lesser width data units to regenerate received data units corresponding to said plurality of data units.

24. The method of claim 23 wherein some adjacent pairs of bits of said p lesser width data units are spaced apart by m bits in the respective serial data stream and at least one adjacent pair of bits of each lesser width data unit is spaced apart by more than m bits in the respective serial data stream.

25. The method of claim 23 wherein each one of said plurality of data units includes a data portion and an error detection code portion.

26. The method of claim 25 further including the step of utilizing said error detection code portion to identify a single bit error in the respective received data unit resulting from a burst error of length less than or equal to m in one of said plurality of serial data channels and generating a signal identifying the single bit error.

27. The method of claim 26 wherein m equals 4.

28. The method of claim 26 wherein m equals 10.

29. The method of claim 23 wherein each of said plurality of data units includes a data portion and an error correction code portion.

30. The method of claim 29 further including the step of utilizing said error correction code to correct a single bit error in the received data unit resulting from a burst error of length less than or equal to m in one of said plurality of serial data channels.

31. The method of claim 30 wherein m equals 4.

32. The method of claim 30 wherein m equals 10.

33. The method of claim 23 further including the step of transmitting over each of said serial data channels a framing signal within the respective serial data stream, said framing signal repeatedly providing an indication of proper word framing following the step of de-serializing the respective received serial data stream.

34. The method of claim 33 wherein said framing signal comprises a fixed data pattern.

35. The method of claim 33 wherein said framing signal comprises a parity bit.

36. The method of claim 33 further including the step of utilizing said framing signal to obtain word framing for the respective de-serialized serial data stream.

37. Apparatus for dynamically changing an interleaving mode for interleaved data being serially transmitted over a serial data channel, said apparatus comprising:

interleave logic operative in a first operational mode to:
receive a first plurality of n bit wide data units;
convert the received n bit wide data units to at least one interleaved serial data stream in which adjacent pairs of bits of said received data units are spaced apart by at least q bits in the serial data stream; and said interleave logic being operative in a second operational mode to:
receive a second plurality of n bit wide data units;
convert the second plurality of received n bit wide data units to at least one interleaved serial data stream in which adjacent pairs of bits of said received data units are spaced apart by at least r bits in the serial data stream, wherein q and r are integers greater than or equal to two and r is greater than q;

said apparatus further including selection logic operative to select one of said first and second operational modes of said interleave logic in response to a mode configuration control signal;

de-interleave logic operative in one of a first operational mode and a second operational mode for receiving and de-interleaving serial data streams produced by said interleave logic when operating in said first or second operational modes respectively, said de-interleave logic operative to receive the respective at least one interleaved serial data stream and to de-interleave the respective at least one interleaved serial data stream to generate a received plurality of n bit wide data units.

38. The method of claim 37 further including the step of generating said configuration mode signal in response to at least one performance criteria measured within a computer network.

39. The method of claim 38 wherein said step of generating said configuration mode signal comprises the step of setting said configuration mode signal to cause said interleave and de-interleave logic to operate in said respective first operational modes upon measuring a first error rate through said serial data channel and setting said configuration mode signal to cause said interleave and de-interleave logic to operate in said second operational mode upon measuring a second error rate through said serial data channel, wherein said second error rate is greater than said first error rate.

40. The method of claim 37 wherein q equals four and m equals ten.

* * * * *

UNITED STATES PATENT AND TRADEMARK OFFICE
CERTIFICATE OF CORRECTION

| | |
|---|---|
| PATENT NO. | : 6,662,332 B1 |
| DATED | : December 9, 2003 |
| INVENTOR(S) | : Myles Kimmitt |

It is certified that error appears in the above-identified patent and that said Letters Patent is hereby corrected as shown below:

Column 3,
Line 22, "2b" should read -- 22b --;

Column 6,
Line 1, "S^" should read -- $S_A$ --;
Line 36, "S^" should read -- $S_A$ --;

Column 15,
Line 65, "(D6...D0)" should read -- (D63..D0) --;

Column 25,
Line 35, delete "a";

Column 32,
Table 9, line 37, "11*11" should read -- 1111 --; and

Column 33,
Table 9, line 60, "5E" should read -- 5F --.

Signed and Sealed this

Fourth Day of January, 2005

JON W. DUDAS
*Director of the United States Patent and Trademark Office*